(12) United States Patent
Yamagata

(10) Patent No.: US 6,810,097 B1
(45) Date of Patent: Oct. 26, 2004

(54) CARRIER REPRODUCTION CIRCUIT, RECEIVER, LOOP FILTER CIRCUIT, AND OSCILLATOR CIRCUIT

(75) Inventor: Taku Yamagata, Kanagawa (JP)

(73) Assignee: Sony Corporation, Tokyo (JP)

( * ) Notice: Subject to any disclaimer, the term of this patent is extended or adjusted under 35 U.S.C. 154(b) by 655 days.

(21) Appl. No.: 09/705,688

(22) Filed: Nov. 3, 2000

(30) Foreign Application Priority Data

Nov. 5, 1999 (JP) .......................................... 11-314922

(51) Int. Cl.$^7$ ............................................... H03D 3/24
(52) U.S. Cl. ..................................... 375/344; 375/376
(58) Field of Search ........................ 329/304; 708/319, 708/320; 375/344, 326, 376; 331/1 A

(56) References Cited

U.S. PATENT DOCUMENTS 5,572,553 A * 11/1996 Kimiavi et al. ............. 375/344
5,764,102 A * 6/1998 Cochran et al. ............ 329/304
6,018,556 A * 1/2000 Janesch et al. ............. 375/376
6,028,488 A * 2/2000 Landman et al. ........... 331/1 A
6,072,842 A * 6/2000 Janesch et al. ............. 375/326
6,279,021 B1 * 8/2001 Takano et al. .............. 708/319

* cited by examiner

Primary Examiner—Kevin M Burd
(74) Attorney, Agent, or Firm—Frommer Lawrence & Haug LLP; William S. Frommer; Darren M. Simon

(57) ABSTRACT

A carrier reproduction circuit comprising a complex multiplier circuit for generating a first signal by detecting a difference between a received signal and a signal fed back at a Costas loop circuit, a loop filter circuit for generating a second signal by processing the first signal by using a first integration loop containing a first delay circuit for giving one-symbol's worth of a delay, and an NCO circuit for feeding back the signal generated by processing the second signal by using a second integration loop containing a second delay circuit for giving one-symbol's worth of delay toward the complex multiplier circuit and switching the loop filter circuit and the NCO circuit to a state 12 symbols before in accordance with a TMCC detection signal and thereby capable of performing the carrier reproduction of the received signal at a high speed and with a high precision.

5 Claims, 13 Drawing Sheets

CARRIER REPRODUCTION CIRCUIT, RECEIVER, LOOP FILTER CIRCUIT, AND OSCILLATOR CIRCUIT

BACKGROUND OF THE INVENTION

1. Field of the Invention

The present invention relates to a carrier reproduction circuit used in a receiver for receiving a signal transmitted via for example a satellite, such a receiver, and a loop filter circuit and an oscillator circuit used in the receiver etc.

2. Description of the Related Art

In May 1997, Japan's Radio Regulatory Council gave its stamp of approval to a draft basic plan regarding promotion of broadcasting by satellites following the existing four systems (hereinafter, referred to as "post-BS-4 satellites") so as to take over for example the standard television broadcasting of the stage of the third broadcasting satellite using the satellite use frequency. The plan called for (1) starting digital broadcasting by post-BS-4 satellites by the year 2000, (2) securing in the post-BS-4 satellites transitional channels for broadcasting of the same content as the existing four systems of broadcasting so as to take over the standard television broadcasting of the stage of the third broadcasting satellite, and (3) focusing on high definition television (HDTV) broadcasting other than (2).

Upon receipt of this report, the Japan Digital Broadcasting System Committee discussed technical conditions such as a transmission line encoding systems, multiplexing systems, a limited reception systems, and information source encoding systems assuming the requested conditions for satellite digital broadcasting based on proving tests. It issued a report concerning the technical conditions of the satellite digital broadcasting system in February 1998.

In this report, the Committee called for the adoption of trellis coded 8-phase shift keying (TC8PSK) with its high efficiency of frequency utilization among the phase shift keying (PSK) modulation systems suited for satellite transmission in the application of the specific transmission line encoding. Further, it decided on a system enabling switching to another PSK modulation system such as a quadrature PSK (QPSK) system since there is a tradeoff between efficiency of frequency utilization and tolerance to attenuation by rain and enabling achievement of a further higher service time rate. On the other hand, it also envisioned that a plurality of HDTV signals of different carriers would be multiplexed and transmitted by a single satellite repeater and considered as well transmission by a plurality of transport streams (TS) in order to improve the independence of Individual programs. Further, it called for multiplexing of transmission and multiplexing configuration control (TMCC) signals for control for transmission systems in areas other than MPEG control items, for example, the switching of the modulation systems and flexible configuration of a plurality of transport streams.

A TMCC signal contains TMCC information indicating a transport stream and modulation system for every slot data in a frame.

Below, an explanation will be made of the transmission line encoding system described in the report.

FIG. 1 is a view of the configuration of a broadcast satellite transmitter 1 employing the related transmission line encoding system.

As shown in FIG. 1, the broadcast satellite transmitter 1 has a Reed-Solomon encoder 2, a frame builder 3, an energy disperser 4, an interleaver 5, a convolution/trellis encoder 6, a TMCC signal generator 7, a Reed-Solomon encoder 8, an energy disperser 9, a modulator 10, and a burst signal generator 11.

The Reed-Solomon encoder 2 sequentially receives as its input, as shown in FIG. 2A, 188 bytes of Moving Picture Experts Group transport stream (MPEG-TS) packets S0 having one byte of an MPEG use synchronization word (47h) in a header, performs Reed-Solomon (204, 188) encoding on the MPEG-TS packets S0, and generates 204 bytes of slot data S2 shown in FIG. 2B comprised of the MPEG-TS packets S0 plus 16 bytes of parity data.

The frame builder 3, as shown in FIG. 2C, builds a frame $FL_1$ by 48 slots $SL_{1-1}$ to $SL_{1-48}$ input from the Reed-Solomon encoder 2 and similarly builds frames $FL_2$ to $FL_8$. As shown In FIG. 3, it builds one super frame SFL by the eight frames $FL_1$ to $FL_8$.

Note that, in FIG. 3, a case where the header bytes of the slot data are replaced by a frame synchronization signal portion $TAB_2$, a super frame synchronization signal $TAB_2$, and a TMCC signal portion is shown, but the header bytes of the slot data in the super frame SFL built by the frame builder 3 become MPEG use synchronization words.

The energy disperser 4 performs energy dispersal processing for adding a pseudo random signal generated by for example "$X^{15}+X^{14}+1$" in order to avoid a succession of the same logic values except at the header bytes of the slot data (MPEG use synchronization words) in units of the super frames SFL input from the frame builder 3.

The interleaver 5 writes the super frame SFL subjected to the energy dispersal processing at the energy disperser 4 into a buffer memory and performs a read operation in a predetermined read direction except at the header byte of the slot data to thereby interleave the data.

The TMCC signal generator 7 uses the input TMCC information SI to generate, as shown in FIG. 4, 8 bytes of TMCC signals per frame and the 2 bytes of frame synchronization signal $TAB_1$ and the super frame synchronization signal $TAB_2$ added before and after them. As shown in FIG. 4, synchronization words $W_1$ for frame synchronization are set in the frame synchronization signals $TAB_1$ of the frames $FL_1$ to $FL_8$. The TMCC information is set in the TMCC signals of the frames $FL_1$ to $FL_6$. The parity data of the TMCC information to be added at the Reed-Solomon encoder 8 are set in the TMCC signals of the frames $FL_7$ and $FL_8$. A synchronization word $W_2$ for super frame synchronization is set in the super frame synchronization signal $TAB_2$ of the frame $FL_1$. Synchronization words $W_3$ for frame synchronization are set in the super frame synchronization signals $TAB_2$ of the frames $FL_2$ to $FL_8$. Here, the synchronization word $W_3$ is obtained by inverting all the bits of the synchronization word $W_2$.

The Reed-Solomon encoder 8 performs Reed-Solomon (64, 48) encoding in units of the TMCC signals (TMCC information) of the frames $FL_1$ to $FL_6$ of the super frame SFL shown in FIG. 4 and sets the resultant parity data in the TMCC signals of the frames $FL_7$ and $FL_8$ shown in FIG. 4. The Reed-Solomon encoder 8 does not encode the frame synchronization signal $TAB_1$ and the super frame synchronization signal $TAB_2$.

The energy disperser 9 performs energy dispersal processing of the TMCC signals input from an external code error correctert 8. The energy dispersal processor 9 does not perform the energy dispersal processing for the frame synchronization signal $TAB_1$ and the super frame synchronization signal $TAB_2$ but outputs them as they are.

The convolution/trellis encoder 6 generates transmission signals by replacing the header bytes of the slot data of the super frame SFL input from the interleaver 5 by the frame synchronization signal $TAB_1$, the TMCC signal, and the super frame synchronization signal $TAB_2$ from the energy disperser 9, performs convolution encoding on the signals, among the related transmission signals, to be subjected to binary PSK (BPSK) or QPSK modulation at the modulator 10, and performs trellis encoding on the signals to be subjected to the 8PSK modulation at the modulator 10, and outputs the results thereof to the modulator 10.

The modulator 10 performs BPSK modulation on the convolution encoded frame synchronization signal $TAB_1$, TMCC signal, and super frame synchronization signal $TAB_2$ and sequentially transmits them, then transmits the main signals of the slot data modulated by the individual modulation systems and building the super frame SFL. Note that the modulation system of each slot data is designated by the TMCC information of the TMCC signal in the super frame two super frames before.

Further, the modulator 10 inserts and transmits a burst signal S11 generated at the burst signal generator 11 between the main signals of the modulated slot data in order to enable stable reception at the receiver by lowering a C/N characteristic.

Specifically, as shown in FIG. 5A, when looking at one frame's worth of the transmission signal S10, the modulator 10 sequentially transmits one frame's worth, that is, a total of 12 bytes, of the frame synchronization signal $TAB_1$, TMCC signal, and the super frame synchronization signal $TAB_2$ by using 192 symbols, then inserts and transmits 4 symbols of the BPSK modulated burst signal for every main signal of 203 symbols other than the 192 symbols of the TMCC signal based on the burst insertion control signal shown in FIG. 5B.

At this time, the 203 bytes of the slot data (main signal unit) other than the header bytes shown in FIGS. 5A and 5B are transmitted by 812 (203×4) symbols.

Further, the modulation system of the main signal can be designated in units of slot data. When slot data of a plurality of modulation systems are transmitted by an identical carrier, the transmission is carried out in the order of the 203 bytes of the slot data modulated by the modulation system having the larger number of phases such as 8PSK, QPSK, and BPSK, that is, the slot data having the higher compression rates.

Note that, in practice, as the modulation system of the main signal, 8PSK is selected with the highest probability. In addition, 8PSK modulation is employed with a probability of close to 100% for the main signal of the slot data immediately after the super frame synchronization signal $TAB_2$.

When the signal transmitted from the broadcast satellite transmitter 1 is received via the broadcast satellite at the broadcast satellite receiver, the broadcast satellite receiver first reproduces the carrier by using the TMCC signal and burst signal known to be subjected to the BPSK modulation. By reproducing the carrier in this way, the receiver can receive the signals stubbly even under conditions with a large noise level.

Next, the broadcast satellite receiver demodulates the received signals. At this time, it performs BPSK demodulation on the frame synchronization signal $TAB_1$, TMCC signal, and super frame synchronization signal $TAB_2$ since the modulation system is always BPSK.

Further, the corresponding TMCC signals for the main signals of the third and following super frames contained in the received signals are contained in the super frames two frames before as mentioned before, and the related TMCC signals have been already decoded. The receiver demodulates these signals based on the modulation system indicated by the related TMCC signals.

Summarizing the problems to be solved by the invention, as mentioned above, the broadcast satellite receiver has to first detect the TMCC signals in order to reproduce the carrier using the TMCC signal and the burst signal. Usually, there is the problem that the related TMCC signal cannot be detected unless the carrier is accurately reproduced.

For this reason, usually, the carrier is reproduced by regarding the entire received signals as a TMCC signal and burst signal known to have been modulated by BPSK in advance, the TMCC signal is detected in that process, and, after detecting the TMCC signal, the carrier reproduction circuit reproduces the carrier for only the portion of the TMCC signal and the burst signal under the control of the control circuit based on the detection timing of the TMCC signal.

The broadcast satellite receiver, however, requires a predetermined time from the reception of the TMCC signal to the detection of the TMCC signal. Therefore, at the time for outputting an instruction for stopping the carrier reproduction processing to the carrier reproduction circuit by the control circuit, the carrier reproduction circuit has already received as input signals other than the TMCC signal and the burst signal and has started the processing. Accordingly, there is a problem that noise enters the carrier reproduction loop, convergence is delayed, and the performance of the broadcast satellite receiver is lowered.

SUMMARY OF THE INVENTION

An object of the present invention is to provide a carrier reproduction circuit capable of reproducing a carrier of received signals at a high speed and high precision, a receiver using the related carrier reproduction circuit, and a loop filter circuit and an oscillator circuit used in the related carrier reproduction circuit.

According to a first aspect of the present invention, there is provided a carrier reproduction circuit of the present invention is a carrier reproduction circuit for reproducing a carrier of an input signal modulated to change in carrier according to the types of symbols by processing using a synchronization loop, comprising a differential detection circuit for detecting a difference between said input signal and a signal fed back in said synchronization loop to generate a first signal, a loop filter circuit for processing said first signal to generate a second signal by using a first integration loop containing a first delay circuit for giving $n$ (n is a natural number), symbols' worth of delay and inputting said first signal of $m$ (m is a natural number) symbols before to said first integration loop in accordance with a switch signal, an oscillator circuit for feeling back an oscillation signal, which is produced by using said second signal by using a second integration loop containing a second delay circuit for giving $n$ symbols' worth of delay, toward said differential detection circuit, and switching said second integration loop to a state holding said second signal of $m$ symbols before in accordance with said switch signal, and a signal generation circuit for generation a carrier reproduced signal by using said input signal and said oscillation signal.

The mode of operation of the carrier reproduction circuit of the present invention is as follows.

In the carrier reproduction circuit of the present invention, a synchronization loop (carrier reproduction loop) is configured by the differential detection circuit, loop filter circuit, and oscillator circuit.

The differential detection circuit detects the difference between the input signal and the signal fed back in the synchronization loop to generate the first signal.

Then, the loop filter circuit processes said first signal to generate the second signal by using the first integration loop containing the first delay circuit for giving n (n is a natural number) symbols' worth of delay. At this time, when a switch operation is indicated by the switch signal, said first integration loop receives as input said first signal of m (m is a natural number) symbols before, and the first integration loop processes said first signal of m symbols before.

Then, the oscillator circuit processes said second signal by using the second integration loop containing the second delay circuit for giving n symbols' worth of delay and feeds back the generated signal toward said differential detection circuit. At this time, when a switch operation is indicated by the switch signal, said second integration loop can be switched to the state holding said second signal of m symbols before.

The carrier reproduction circuit of the present invention, as mentioned above, can switch the first integration loop of the loop filter circuit and the second integration loop of the oscillator circuit to a state of m symbols before by the switch signal.

Further, in the carrier reproduction circuit of the present invention, preferably said input signal is a signal modulated to change in the phase of the carrier in accordance with the type of the symbol, said differential detection circuit generates said first signal indicating the difference in phases between said input signal and the signal fed back in said synchronization loop, and said carrier reproduction circuit further has a multiplier circuit for performing multiplication based on said signal fed back and said input signal to generate a carrier produced signal.

Further, in the carrier reproduction circuit of the present invention, preferably said loop filter circuit has a first adder circuit for adding said first signal and a third signal and outputting the result toward said first delay circuit, a third delay circuit for delaying the output of said first adder circuit by exactly m symbols, a selection circuit for selecting either of the output of said first delay circuit and the output of said third delay circuit in accordance with said switch signal and outputting the result as said third signal to said first adder circuit, and a second adder circuit for adding said first signal and the output of said first adder circuit to calculate said second signal.

Further, in the carrier reproduction circuit of the present invention, preferably said oscillator circuit has a first adder circuit for adding said first signal and a third signal and outputting the result toward said second delay circuit, an amplifier circuit for amplifying said first signal to m×s times when a single symbol can express s number of statuses, a second adder circuit for adding the output of said first adder circuit and the output of said amplifier circuit, a third delay circuit for delaying the output of said second adder circuit by exactly m symbols, and a selection circuit for selecting either of the output of said second delay circuit and the output of said third delay circuit in accordance with said switch signal and outputting the same as said third signal to said first adder circuit.

According to a second aspect of the present invention, there is provided a receiver for processing received signals containing a main signal modulated by a modulation system selected from among a plurality of modulation systems for changing the carrier in accordance with the type of the symbol and a modulation system indication signal indicating the modulation system of said main signal and modulated by a modulation system determined in advance, comprising a carrier reproduction circuit for processing said modulation system indication signal contained in said received signals to reproduce carriers by using a synchronization loop, a demodulation circuit for demodulating said carrier reproduced received signals by indicated demodulation systems, a signal detection circuit for detecting said modulation system indication signal contained in said demodulated received signals and outputting a detection signal indicating the related detection timing to said carrier reproduction circuit, and a demodulation system determination circuit for indicating the demodulation system corresponding to the modulation system indicated by said detected modulation system indication signal to said demodulation circuit, wherein said carrier reproduction circuit has a differential detection circuit for detecting a difference between said input signal and a signal fed back in said synchronization loop to generate a first signal, a loop filter circuit for processing said first signal to generate a second signal by using a first integration loop containing a first delay circuit for giving n (n is a natural number) symbols' worth of delay and inputting said first signal of m (m is a natural number) symbols before to said first integration loop in accordance with a switch signal, an oscillator circuit for feeling back an oscillation signal, which is produced by using said second signal by using a second integration loop containing a second delay circuit for giving n symbols' worth of delay, toward said differential detection circuit, and switching said second integration loop to a state holding said second signal of m symbols before in accordance with said switch signal, and a signal generation circuit for generation a carrier reproduced signal by using said input signal and said oscillation signal.

The mode of operation of the receiver of the present invention is as follows.

The carrier reproduction circuit reproduces the carriers by processing the modulation system indication signal contained in the received signals by using the synchronization loop.

Then, the demodulation circuit demodulates said carrier reproduced received signals by the designated demodulation system.

Then, the signal detection circuit detects said modulation system indication signal contained in said demodulated received signals and outputs the detection signal indicating the related detection timing to said carrier reproduction circuit.

Then, the demodulation system determination circuit instructs the demodulation system corresponding to the modulation system indicated by said detected modulation system indication signal to said demodulation circuit.

In the receiver of the present invention, the carrier reproduction circuit uses the detection signal output from the signal detection circuit to the carrier reproduction circuit as the switch signal of the carrier reproduction circuit and performs similar processing to that of the above carrier reproduction circuit.

Further, in the receiver of the present invention, preferably said received signal is a signal modulated for changing the phases of the carriers in accordance with the plurality of types of symbols, said differential detection signal is for generating said first signal indicating the difference in phase between said received signal and the signal fed back at said synchronization loop, and said carrier reproduction circuit further has a multiplier circuit for performing multiplication based on said signal fed back and said input signal to generate a carrier reproduced signal.

According to a third aspect of the present invention, there is provided a loop filter circuit comprising a first adder circuit for adding a first signal and a second signal, a first delay circuit for delaying the output of said first adder circuit by exactly $\underline{n}$ (n is a natural number) symbols, a second delay circuit for delaying the output of said first adder circuit by exactly $\underline{m}$ (m is a natural number) symbols, a selection circuit for selecting either of the output of said first delay circuit and the output of said second delay circuit in accordance with a switch signal and outputting the same as said second signal to said first adder circuit, and a second adder circuit for adding said first signal and the output of said first adder circuit to calculate said second signal.

Further, the loop filter circuit of the present invention is preferably used in a carrier reproduction circuit for reproducing the carrier of an input signal modulated to change in the phase of the carrier in accordance with the type of symbols by processing using a synchronization loop, and said first signal is a signal indicating the phase.

According to a fourth aspect of the present invention, there is provided an oscillator circuit used in a carrier reproduction circuit for reproducing a carrier of an input signal modulated to change in the phase of the carrier in accordance with the type of symbols by processing using a synchronization loop, comprising a first adder circuit for adding an input phase differential signal and phase signal to generate a carrier phase reproduced signal, a first delay circuit for delaying the output of said first adder circuit by exactly $\underline{n}$ (n is a natural number) symbols, an amplifier circuit for amplifying said phase differential signal to $\underline{m}$ (m is a natural number)×s times when a single symbol can express s number of statuses, a second adder circuit for adding the output of said first adder circuit and the output of said amplifier circuit, a second delay circuit for delaying the output of said second adder circuit by exactly $\underline{m}$ symbols, a selection circuit for selecting either of the output of said first delay circuit and the output of said second delay circuit in accordance with said switch signal and outputting the same as the phase signal to said first adder circuit, and a signal generation circuit for generating an oscillation signal having a phase indicated by said phase signal.

BRIEF DESCRIPTION OF THE DRAWINGS

The above object and features of the present invention will be more apparent from the following description of the preferred embodiments given with reference to the accompanying drawings, wherein.

DESCRIPTION OF THE PREFERRED EMBODIMENTS

Below, an explanation will be made of the broadcast satellite receiver according to the present invention.

Figure 6:
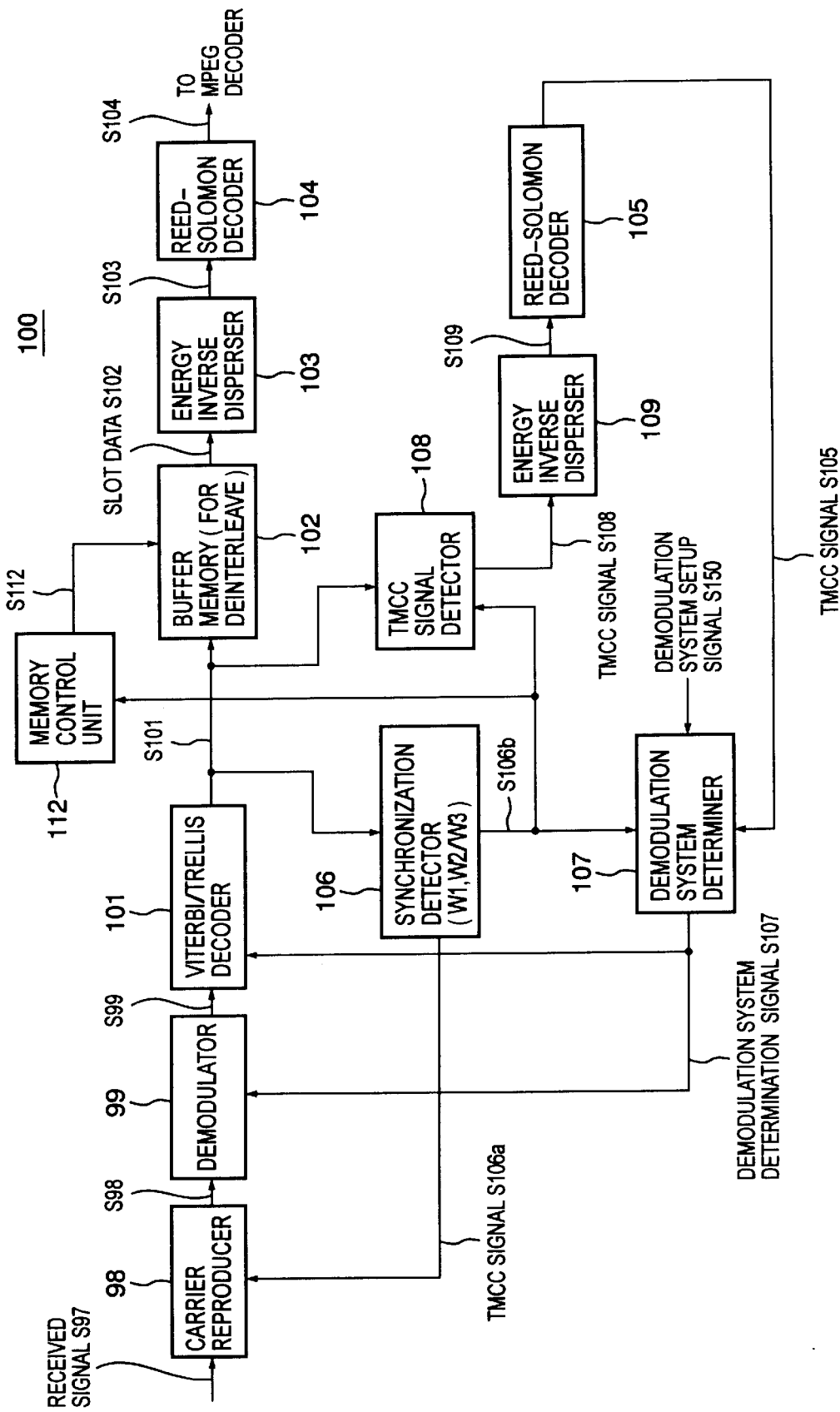
FIG. 6 is a view of the configuration of a broadcast satellite receiver of a first embodiment of the present invention.

FIG. 6 is a view of the configuration of a broadcast satellite receiver 100 of the present embodiment.

As shown in FIG. 6, the broadcast satellite receiver 100 comprises a carrier reproducer 98, a demodulator 99, a viterbi/trellis decoder 101, a buffer memory 102 for deinterleaving, an energy inverse disperser 103, Reed-Solomon decoders 104 and 105, a synchronization signal detector 106, a demodulation system determiner 107, a TMCC detector 108, an energy inverse disperser 109 and a memory control unit 112.

Here, the carrier reproducer 98 corresponds to the carrier reproduction circuits of claim 1, claim 5, etc., the demodulator 99 corresponds to the demodulation circuit of claim 5, the synchronization signal detector 106 corresponds to the signal detection circuit of claim 5, and the demodulation system determiner 107 corresponds to the demodulation system determination circuit of claim 5.

Further, in the present embodiment, an explanation will be made by using as an example a case where $\underline{n}$ in claims 1, 5, and 9 is "1", m is "12", and s is "2".

Figure 1:
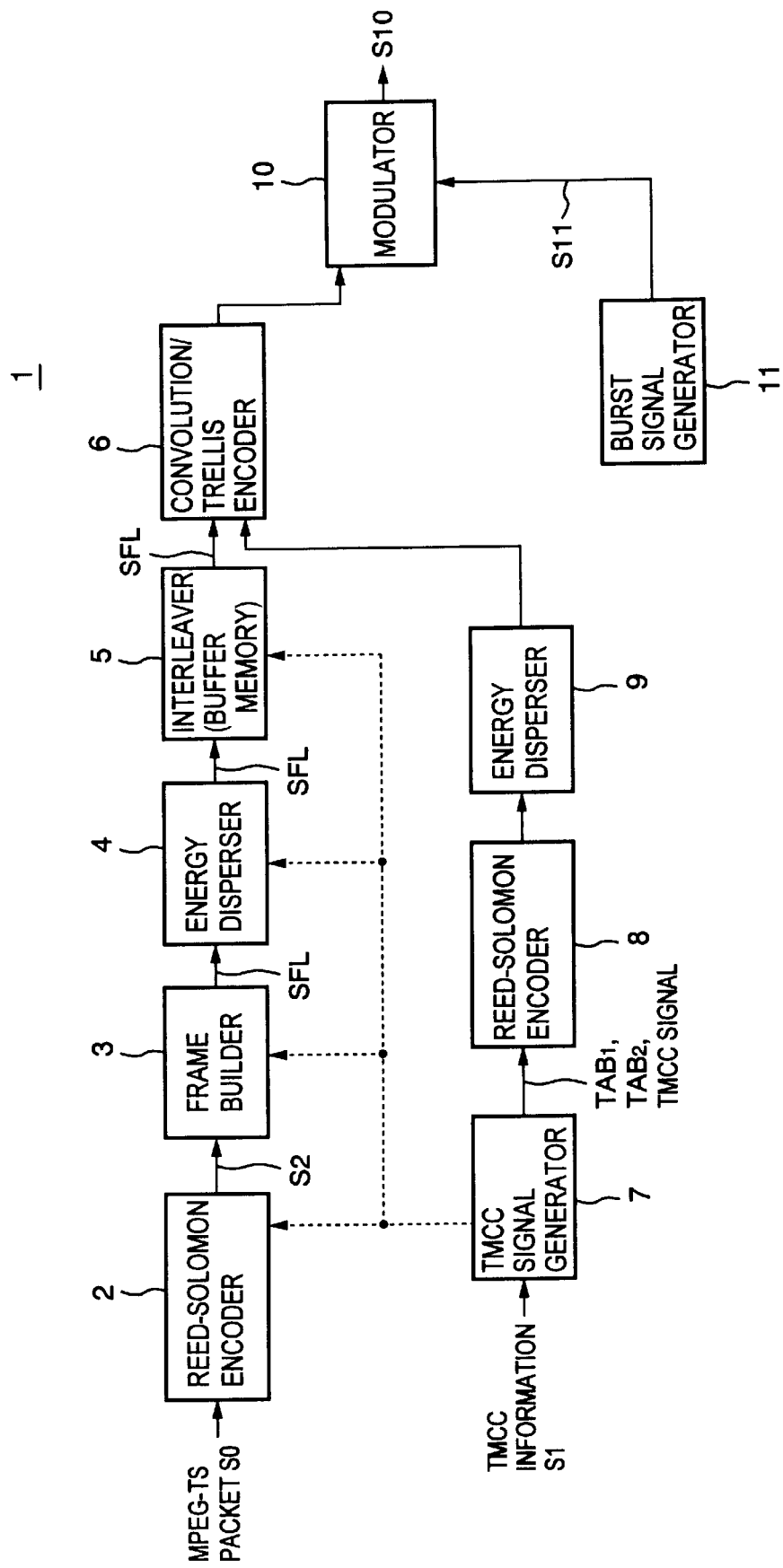
FIG. 1 is a view of the configuration of a broadcast satellite transmitter employing a transmission line encoding system upon which the present invention is predicated.
Figure 2:
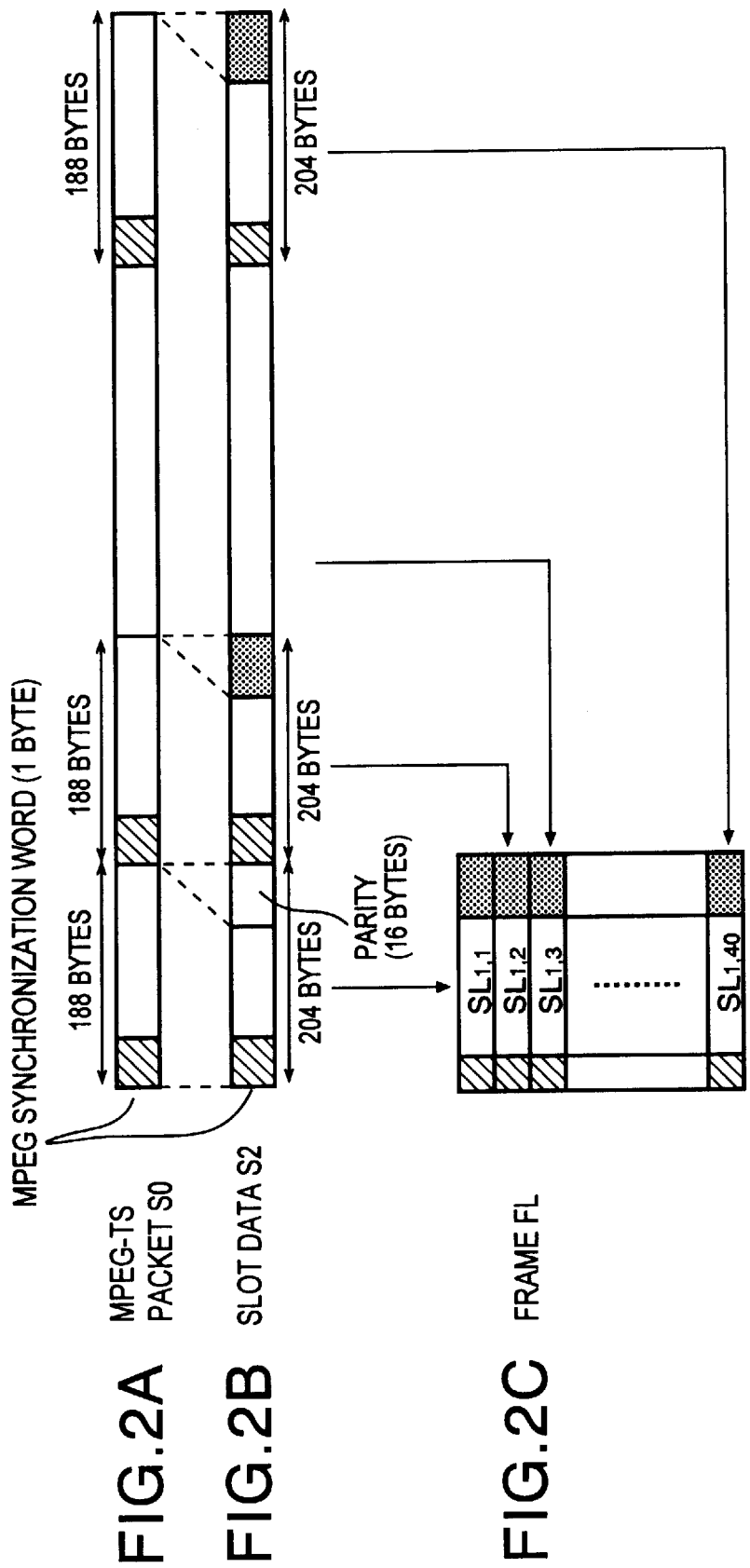
FIGS. 2A to 2C are views for explaining the processing of the broadcast satellite transmitter shown in FIG. 1.
Figure 3:
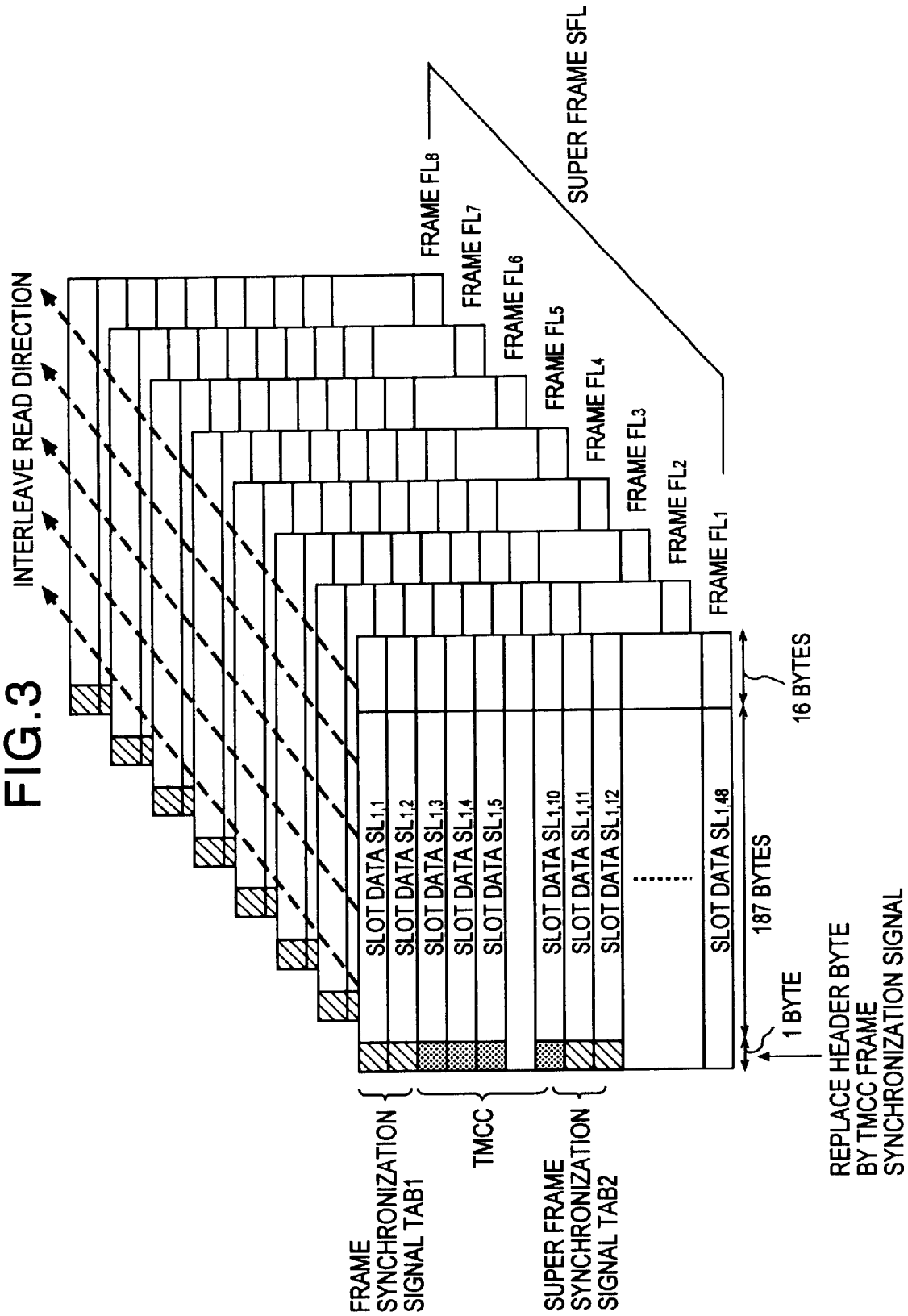
FIG. 3 is a view for explaining the format of a transmission signal of the broadcast satellite transmitter shown in FIG. 1.
Figure 5:
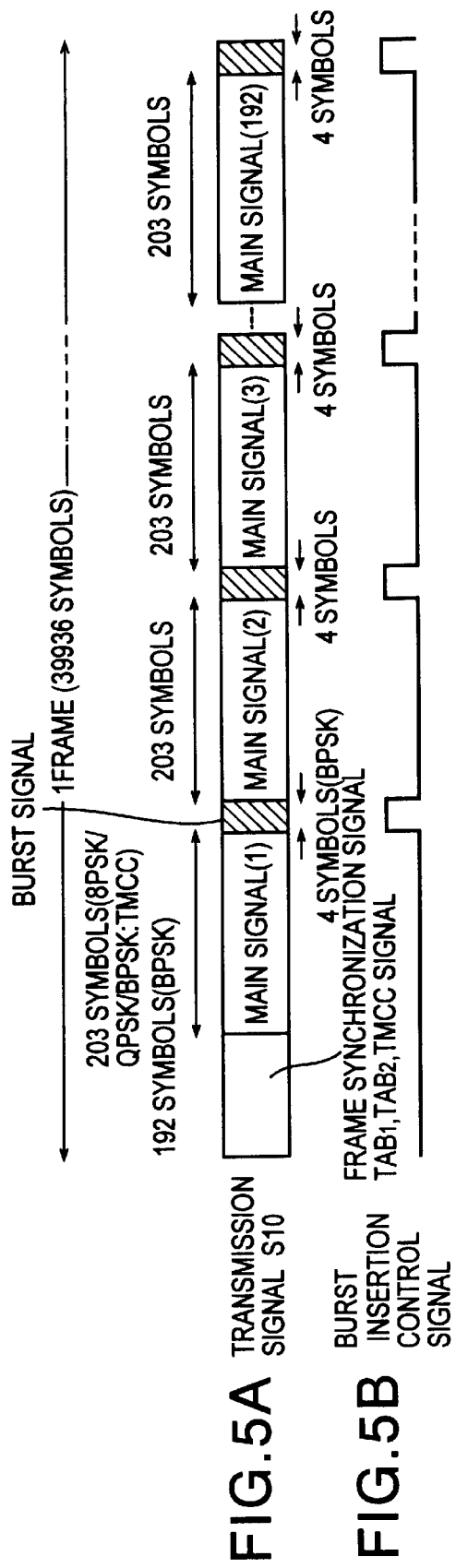
FIGS. 5A and 5B are views for explaining the transmission signal after modulation in the broadcast satellite transmitter shown in FIG. 1.

The broadcast satellite receiver 100 receives a transmission signal S10 shown in FIG. 5 transmitted by the broadcast satellite transmitter 1 shown in FIG. 1 at its antenna via a not illustrated broadcast satellite as a received signal S97 and outputs the same to a Costas loop circuit 98 shown in FIG. 6.

Below, a detailed explanation will be given of the components shown in FIG. 6.

[Carrier Reproducer 98]

The carrier reproducer 98 reproduces the carrier (detects synchronization) of the input received signal S97 to generate a received signal S98 without phase error and outputs the received signal S98 to the demodulator 99.

Figure 7:
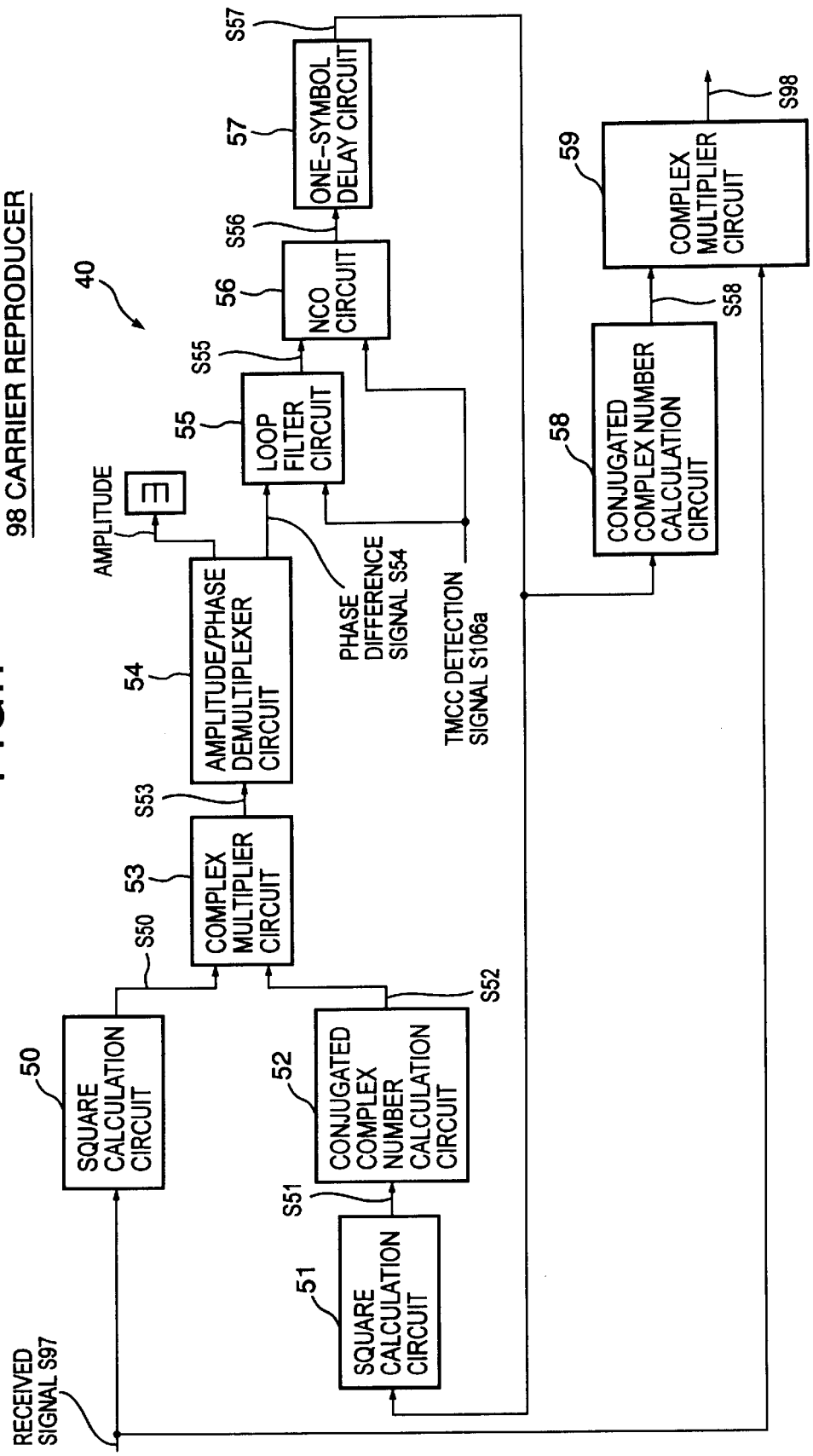
FIG. 7 is a view of the configuration of a carrier reproducer shown in FIG. 6.

FIG. 7 is a view of the configuration of the carrier reproducer 98 shown in FIG. 6.

As shown in FIG. 7, the carrier reproduction circuit unit 98 has a square calculation circuit 50, a square calculation circuit 51, a conjugated complex number calculation circuit 52, a complex multiplier circuit 53, an amplitude/phase demultiplexer circuit 54, a loop filter circuit 55, a numerical control oscillator (NCO) circuit 56, a one-symbol delay circuit 57, a conjugated complex number calculation circuit 58, and a complex multiplier circuit 59.

In FIG. 7, the square calculation circuit 50, square calculation circuit 51, conjugated complex number calculation circuit 52, complex multiplier circuit 53, amplitude/phase demultiplexer circuit 54, loop filter circuit 55, NCO circuit 56 and the one-symbol delay circuit 57 constitute a Costas loop circuit 40 serving as the synchronization loop of the present invention.

Further, as for the correspondence to claim 1 of the invention, for example, the square calculation circuit 50, square calculation circuit 51, conjugated complex number calculation circuit 52, and complex multiplier circuit 53 correspond to the differential detection circuit of the present invention, the loop filter circuit 55 corresponds to the loop filter circuit of the present invention, and the NCO circuit 56 corresponds to the oscillator circuit of the present invention. Further, the complex multiplier circuit 59 corresponds to the multiplier circuit of the invention of claim 2.

<Square Calculation Circuit 50>

The square calculation circuit 50 receives as its input a received signal S97 having a phase error $\omega t$ and expressed by $\exp(J(\theta+\omega t))$, calculates the square thereof, and outputs a signal S50 expressed by $\exp(2j(\theta+\omega t))$ to the complex multiplier circuit 53.

<Square Calculation Circuit 51>

The square calculation circuit 51 receives as its input a signal S57 expressed by $\exp(j\omega' t)$ input from the one-symbol delay circuit 57, calculates the square thereof, and outputs a signal S51 expressed by $\exp(2j\omega' t)$ to the conjugated complex number calculation circuit 52.

Here, when the Costas loop circuit 40 is in an unlocked state, $\omega'$ is not equal to $\omega$, while when the Costas loop circuit 40 is in a locked state, $\omega'$ is equal to $\omega$.

<Conjugated Complex Number Calculation Circuit 52>

The conjugated complex number calculation circuit 52 receives as its input the signal S51 from the square calculation circuit 51, calculates the conjugated complex number thereof, and outputs a signal S52 expressed by $\exp(-2j\omega' t)$ to the complex multiplier circuit 53.

<Complex Multiplier Circuit 53>

The complex multiplier circuit 53 receives as its inputs the signal S50 and the signal S52, performs the complex multiplication of them, and outputs a signal S53 expressed by $\exp(2j\theta) \cdot \exp(2j(\omega-\omega')t)$ to the amplitude/phase demultiplexer circuit 54.

Here, in BPSK, $\theta=0$ or $\Pi$, so $\exp(2j\theta)$ becomes "1", and the signal S53 expressed by $\exp(2j(\omega-\omega')t)$ is output to the amplitude/phase demultiplexer circuit 54.

<Amplitude/phase Demultiplexer Circuit 54>

The amplitude/phase demultiplexer circuit 54 demultiplexes the signal S53 to the amplitude and the phase and outputs a phase difference signal S54 indicating $2(\omega-\omega')t$ as the phase of the signal S53 to the loop filter circuit 55.

<Loop Filter Circuit 55>

The loop filter circuit 55 usually performs the loop filter processing by an integration loop containing the one-symbol delay circuit, receives as its input data of 12 symbols before at its integration loop at a timing when a TMCC detection signal S106a rises, and the related integration loop becomes a state of 12 symbols before.

Figure 8:
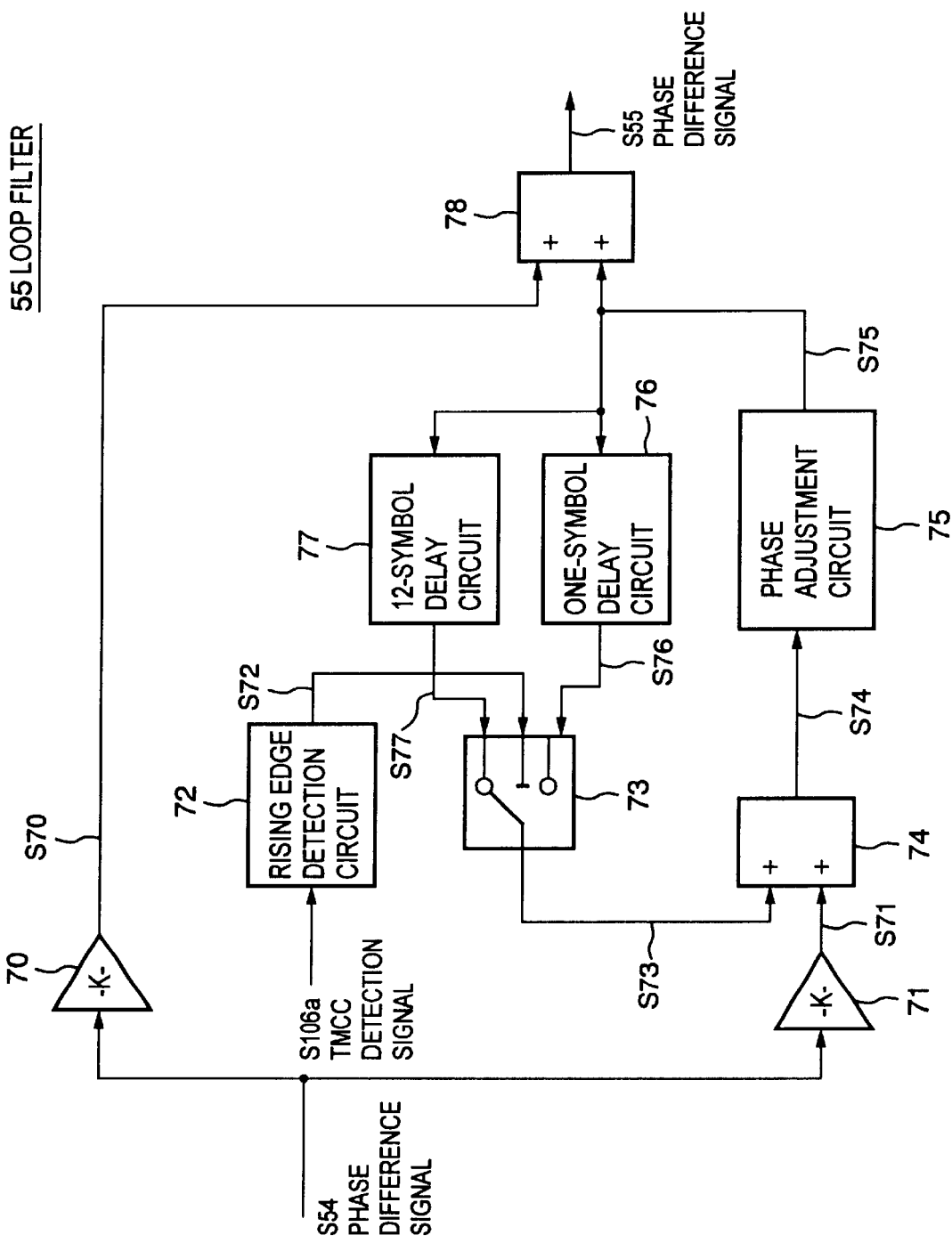
FIG. 8 is a view of the configuration of a loop filter circuit shown in FIG. 7.

FIG. 8 is a view of the configuration of the loop filter circuit 55.

As shown in FIG. 8, the loop filter circuit 55 comprises amplifier circuits 70 and 71, a rising edge detection circuit 72, a switch circuit 73, an adder circuit 74, a phase adjustment circuit 75, a one-symbol delay circuit 76, a 12-symbol delay circuit 77, and an adder circuit 78.

The correspondence between the inventions of claim 1, claim 3, and claim 7 and the components of FIG. 8 is as follows. The one-symbol delay circuit 76 corresponds to the first delay circuit of the present invention, the adder circuit 74 corresponds to the first adder circuit of the present invention, the 12-symbol delay circuit 77 corresponds to the third delay circuit of the present invention, the switch circuit 73 corresponds to the selection circuit of the present invention, and the adder circuit 78 corresponds to the second adder circuit of the present invention.

Further, the switch circuit 73, adder circuit 74, phase adjustment circuit 75, and the one-symbol delay circuit 76 constitute the first integration loop of the present invention.

The amplifier circuit 70 amplifies the phase difference signal S54 input from the amplitude/phase demultiplexer circuit 54 shown in FIG. 7 by an amplification rate K and outputs an amplified phase difference signal S70 to the adder circuit 78.

The amplifier circuit 71 amplifies the phase difference signal S54 input from the amplitude/phase demultiplexer circuit 54 shown in FIG. 7 by an amplification rate K and outputs an amplified phase difference signal S71 to the adder circuit 74.

The rising edge detection circuit 72 detects the rising edge of the TMCC detection signal S106a from the synchronization signal detector 106 shown in FIG. 6 and outputs a switch signal S72 for generating a pulse at a timing of detecting the related rising edge to the switch circuit 73.

The switch circuit 73 connects the switch to the one-symbol delay circuit 76 side when a pulse is not generated in the switch signal S72 and outputs a phase difference signal S76 from the one-symbol delay circuit 76 as a phase difference signal S73 to the adder circuit 74.

Further, the switch circuit 73 connects the switch to the 12-symbol delay circuit 77 side for one sample's worth of time when a pulse is generated in a switch signal S72 and outputs a phase difference signal S77 from the 12-symbol delay circuit 77 as the phase difference signal S73 to the adder circuit 74.

Here, in BPSK modulation, one symbol is comprised by two samples.

The adder circuit 74 adds the phase difference signal S73 from the switch circuit 73 and the phase difference signal S71 from the amplifier circuit 71 to calculate a phase difference signal S74 and outputs the phase difference signal S74 to the phase adjustment circuit 75.

The phase adjustment circuit 75 generates a signal S75 having a remainder obtained by dividing the phase of the signal S74 from the adder circuit 74 by $2\Pi$ as the phase and outputs this to the one-symbol delay circuit 76 and the adder circuit 78. By this, the signal S75 indicating a phase value within a range of from 0 to $2\Pi$ is output to the one-symbol delay circuit 76 and the adder circuit 78.

The one-symbol delay circuit 76 outputs the signal S76 obtained by delaying the signal S75 from the phase adjustment circuit 75 by exactly one-symbol's worth of time to the switch circuit 73.

The 12-symbol delay circuit 77 outputs the phase difference signal S76 obtained by delaying the phase difference signal S75 from the phase adjustment circuit 75 by exactly 12 symbols' worth of time to the switch circuit 73.

The adder circuit 78 outputs a phase difference signal S55 obtained by adding the phase difference signal S70 from the amplifier circuit 70 and the phase difference signal S75 from the phase adjustment circuit 75 to the NCO circuit 56 shown in FIG. 7.

Below, an explanation will be made of the operation of the loop filter circuit 55 shown in FIG. 8.

In the loop filter circuit 55, during the period where the TMCC signal is not detected at the synchronization signal detector 106 shown in FIG. 6, the rising edge of the TMCC detection signal S106a is not detected at the rising edge detection circuit 72, and a pulse is not generated in the switch signal S72. For this reason, the switch of the switch circuit 73 is connected to the one-symbol delay circuit 76 side, and an integration loop comprised by the one-symbol delay circuit 76, adder circuit 74, and the phase adjustment circuit 75 is formed. Then, the related integration loop filters the phase difference signal S71 from the amplifier circuit 71 and outputs the phase difference signal S75 in accordance with that to the adder circuit 78. Then, the adder circuit 78 adds the phase difference signal S70 and the phase difference signal S75 and outputs the phase difference signal S55 as the result of this to the NCO circuit 56 shown in FIG. 7.

Figure 9:
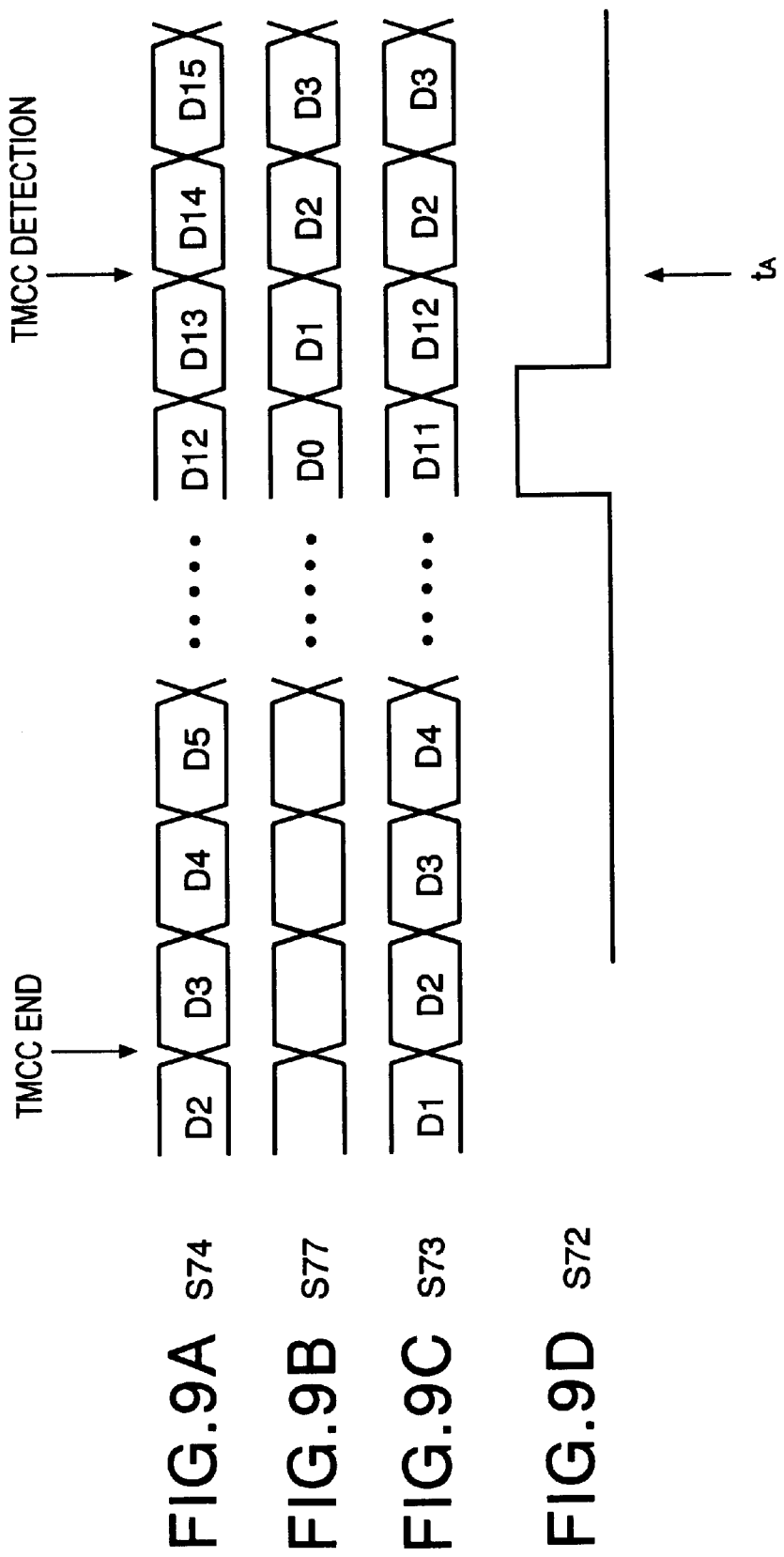
FIGS. 9A to 9D are views for explaining part of the operation of the loop filter circuit shown in FIG. 8.

Thereafter, when the TMCC signal is detected at the synchronization signal detector 106 shown in FIG. 6, the rising edge of the TMCC detection signal S106a is detected at the rising edge detection circuit 72, and as shown in FIG. 9, a pulse is generated in the switch signal S72. By this, the switch of the switch circuit 73 is connected to the 12-symbol delay circuit 77 side for one sample's worth of time, and as shown in FIGS. 9B and 9C, at a timing tA, data of 12 symbols before is input to the integration loop, and the phase difference signal S77 is used as the phase difference signal S73. Then, the integration loop filters the related input phase difference signal S77 and outputs the phase difference signal S75 in accordance with that to the adder circuit 78. Then, the adder circuit 78 adds the phase difference signal S70 and the phase difference signal S75 and outputs the phase difference signal S55 as the result thereof to the NCO circuit 56 shown in FIG. 7.

<NCO Circuit 56>

Figure 10:
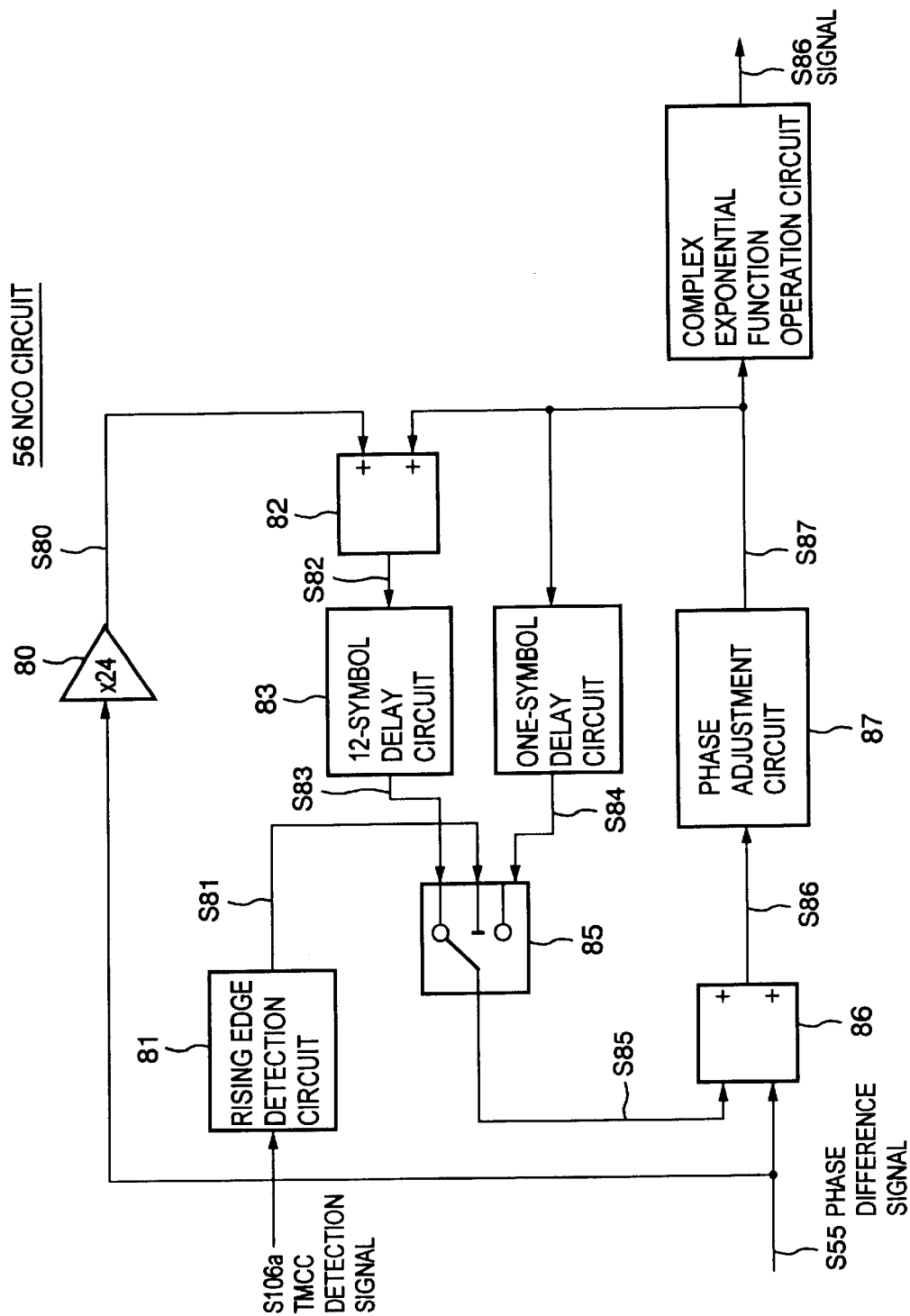
FIG. 10 is a view of the configuration of an NCO circuit shown in FIG. 7.

FIG. 10 is a view of the configuration of the NCO circuit 56 shown in FIG. 7.

As shown in FIG. 10, the NCO circuit 56 has for example an amplifier circuit 80, a rising edge detection circuit 81, an adder circuit 82, a 12-symbol delay circuit 83, a one-symbol delay circuit 84, a switch circuit 85, an adder circuit 86, a phase adjustment circuit 87, and a complex exponential function operation circuit 88.

Here, the correspondence between the components shown in FIG. 10 and the components of the inventions of claim 1 and claim 3 becomes as follows. The one-symbol delay circuit 76 corresponds to the second delay circuit of the present invention, the adder circuit 74 corresponds to the first adder circuit of the present invention, the 12-symbol delay circuit 77 corresponds to the third delay circuit of the present invention, the switch circuit 73 corresponds to the selection circuit of the present invention, and the adder circuit 78 corresponds to the second adder circuit of the present invention.

Also, the correspondence between the components shown in FIG. 10 and the components of the invention of claim 9 becomes as follows. The adder circuit 86 corresponds to the first adder circuit of the present invention, the one-symbol delay circuit 84 corresponds to the first delay circuit of the present invention, the amplifier circuit 80 corresponds to the amplifier circuit of the present invention, the adder circuit 82 corresponds to the second adder circuit of the present invention, the 12-symbol delay circuit 83 corresponds to the second delay circuit of the present invention, and the switch circuit 85 corresponds to the selection circuit of the present invention.

Further, the one-symbol delay circuit 84, switch circuit 85, adder circuit 86, and the phase adjustment circuit 87 constitute the second integration loop of the present invention.

The amplifier circuit 80 amplifies the phase difference signal S55 input from the loop filter circuit 55 shown in FIG. 7 to 24 times to generate a phase difference signal S80 and outputs the phase difference signal S80 to the adder circuit 82.

At this time, the phase difference signal S55 indicates an advance of the phase of one sample, and the phase difference signal S80 indicates the phase after 24 samples (12 symbols).

The adder circuit 82 adds the phase difference signal S80 from the amplifier circuit 80 and the phase difference signal S87 from the phase adjustment circuit 87 to generate a phase signal S82 and outputs the phase signal S82 to the 12-symbol delay circuit 83.

The rising edge detection circuit 81 detects the rising edge of the TMCC detection signal S106a from the synchronization signal detector 106 shown in FIG. 6 and outputs a switch signal S81 for generating the pulse to the switch circuit 85 at the timing of detecting the related rising edge.

The 12-symbol delay circuit 83 outputs a phase signal S83 obtained by delaying the phase signal S82 from the adder circuit 82 by exactly 12 symbols' worth of time to the switch circuit 85.

The one-symbol delay circuit 84 outputs a phase signal S84 obtained by delaying a phase signal S87 from the phase adjustment circuit 87 by exactly one-symbol's worth of time to the switch circuit 85.

The switch circuit 85 connects the switch to the one-symbol delay circuit 84 side when a pulse is not generated in the switch signal S81 and outputs the phase signal S84 from the one-symbol delay circuit 84 as a phase signal S85 to the adder circuit 86.

Further, the switch circuit 85 connects the switch to the 12-symbol delay circuit 83 side for exactly one sample's worth of time when a pulse is generated in the switch signal S81 and outputs the phase signal S83 from the 12-symbol delay circuit 83 as the phase signal S85 to the adder circuit 86.

The adder circuit 86 adds the phase signal S85 from the switch circuit 85 and the phase difference signal S55 from the loop filter circuit 55 to calculate the phase signal S86 and outputs the phase signal S86 to the phase adjustment circuit 87.

The phase adjustment circuit 87 generates the phase signal S87 indicating the phase of the remainder obtained by dividing the phase indicated by a phase signal S86 from the adder circuit 86 by 2Π and outputs this to the one-symbol delay circuit 84, adder circuit 82, and the complex exponential function operation circuit 88. By this, the phase signal S87 indicating the phase within a range of from 0 to 2Π is output to the adder circuit 82, one-symbol delay circuit 84, and the complex exponential function operation circuit 88.

The complex exponential function operation circuit 88 generates a signal S56 indicating a complex exponential function exp(jωt) when the phase signal S87 indicates the phase ωt and outputs the signal S56 to the delay circuit 57 shown in FIG. 7.

The signal S56 indicates exp(jω't) when the NCO circuit 56 is in the unlocked state, while indicates exp(jωt) when the NCO circuit 56 is in the locked state.

Below, an explanation will be made of the operation of the NCO circuit 56 shown in FIG. 10.

In the NCO circuit 56, during a period where the TMCC signal is not detected in the synchronization signal detector 106 shown in FIG. 6, the rising edge of the TMCC detection signal S106a is not detected at the rising edge detection circuit 81, and a pulse is not generated in the switch signal S81. For this reason, the switch of the switch circuit 85 is connected to the one-symbol delay circuit 84 side, and thus an integration loop comprised by the one-symbol delay circuit 84, adder circuit 86, and the phase adjustment circuit 87 is formed. Then, the integration loop filters the phase difference signal S55 from the loop filter circuit 55 shown in FIG. 7 and outputs the phase signal S87 in accordance with that to the complex exponential function operation circuit 88. Then, the complex exponential function operation circuit 88 generates the signal S56 expressing the phase signal S87 by the complex exponential function and outputs the signal S56 to the delay circuit 57 shown in FIG. 7.

Thereafter, when the TMCC is detected at the synchronization signal detector 106 shown in FIG. 6, the rising edge of the TMCC detection signal S106a is detected at the rising edge detection circuit 81, and a pulse is generated in the switch signal S81. By this, the switch of the switch circuit 85 is connected to the 12-symbol delay circuit 83 side for one sample's worth of the time, and by this, the phase before the present phase by 24 samples is input to the integration loop (phase loop) by the one-symbol delay circuit 84, adder circuit 86, and the phase adjustment circuit 87, and the phase signal S87 indicating the present phase where it was locked by the input 24 samples before is generated. Then, the complex exponential function operation circuit 88 generates the signal S56 expressed the phase signal S87 by the complex exponential function and outputs the signal S56 to the delay circuit 57 shown in FIG. 7.

<One-symbol Delay Circuit 57>

The one-symbol delay circuit 57 generates the signal S57 obtained by delaying the signal input from the NCO circuit 56 by exactly one-symbol's worth of time and outputs this to the square calculation circuit 51 and the conjugated complex number calculation circuit 58. <Conjugated complex number calculation circuit 58 >The conjugated complex number calculation circuit 58 receives as its input the signal S57, calculates the conjugated complex number thereof, and outputs a signal S58 in accordance with the related calculation result to the complex multiplier circuit 59.

Note that, where the received signal S97 is expressed by exp(j(θ+ωt)) as mentioned above, in the locked state of the Costas loop circuit 40 shown in FIG. 7, the signal S57 is expressed by exp(jωt). Accordingly, the signal S58 output from the conjugated complex number calculation circuit 58 to the complex multiplier circuit 59 is expressed by exp(-jωt).

<Complex Multiplier Circuit 59>

The complex multiplier circuit 59 performs the complex multiplication of the received signal S97 and the signal S58 from the conjugated complex number calculation circuit 58 to generate a carrier reproduced received signal S98 and outputs the received signal S98 to the demodulator 99 shown in FIG. 6.

Note that, in the locked state of the Costas loop circuit 40 shown in FIG. 7, as mentioned above, the signal S58 is expressed by exp(-Jωt), and the received signal S97 is expressed by exp(J(θ+ωt)), therefore the received signal S98 is expressed by exp(jθO) Namely, the received signal S98 becomes the signal expressed by exp(Jθ) obtained by eliminating a phase error ωt from the received signal S97 expressed by exp(J(θ+ωt)) having the phase error ωt Below, an explanation will be made of the operation of the carrier reproducer 98 shown in FIG. 7.

In the carrier reproducer 98, the loop filter circuit 55 filters the phase difference signal S54 indicating 2(ω-ω')t to generate the phase difference signal S55.

Next, the NCO circuit 56 adds the phase indicated by the phase difference signal S55 to generate the signal S56 having the added phase.

Next, the one-symbol delay circuit 57 generates the signal S57 obtained by delaying the signal S56 by exactly one symbol and outputs the signal S57 to the square calculation circuit 51 and the conjugated complex number calculation circuit 58.

Next, the square calculation circuit 51 calculates the square of the signal S57 and outputs the signal S51 indicating the related calculation result to the conjugated complex number calculation circuit 52.

Next, the conjugated complex number calculation circuit 52 calculates the conjugated complex number of the signal S51 and outputs the signal S52 indicating the related calculation result to the complex multiplier circuit 53.

Further, the square calculation circuit 50 calculates the square of the received signal S97 and outputs the signal S50 indicating the related calculation result to the complex multiplier circuit 53.

Next, the complex multiplier circuit 53 multiplies the signal S50 and the signal S52 and outputs the signal S53 indicating the multiplication result to the amplitude/phase demultiplexer circuit 54.

In the Costas loop circuit 40, in the case of the unlocked state, ω becomes unequal to ω', and the phase difference signal S54 has a value other than zero, while in the case of the locked state, ω becomes equal to ω', and the phase difference signal S54 becomes zero.

When the Costas loop circuit 40 becomes the locked state, the signal S58 is expressed by exp(-jωt), therefore, in the complex multiplier circuit 59, the signal S98 indicating the complex multiplication result of the received signal S97 expressed by exp(j(θ+ωt)) and the signal S58 is expressed by exp(jθ), and a signal with the phase error eliminated is obtained.

In the carrier reproducer 98, when a pulse is not generated in the TMCC detection signal S106 (when the TMCC signal is not detected), the loop filter circuit 55 shown in FIG. 8 and the NCO circuit 56 shown in FIG. 10 perform processing using the integration loops (carrier reproduction loops) containing the one-symbol delay circuits 76 and 84, but when a pulse is generated in the TMCC detection signal S106 (when the TMCC signal is detected), the integration loops of the loop filter circuit 55 shown in FIG. 8 and the NCO circuit 56 shown in FIG. 10 are switched to the statuses 12 symbols before as mentioned before.

For this reason, even in a case where there is a delay of about 12 symbols' worth of time from when the carrier reproducer 98 starts the input of the TMCC signal contained in the received signal S97 to when a pulse is generated in the TMCC detection signal S106a, mixing of a signal modulated by a modulation system other than the BPSK modulation continuing from the TMCC signal into the integration loop as noise can be effectively suppressed. As a result, a convergence time of the integration loop can be shortened, and high precision carrier reproduction with a high response becomes possible.

Figure 11:
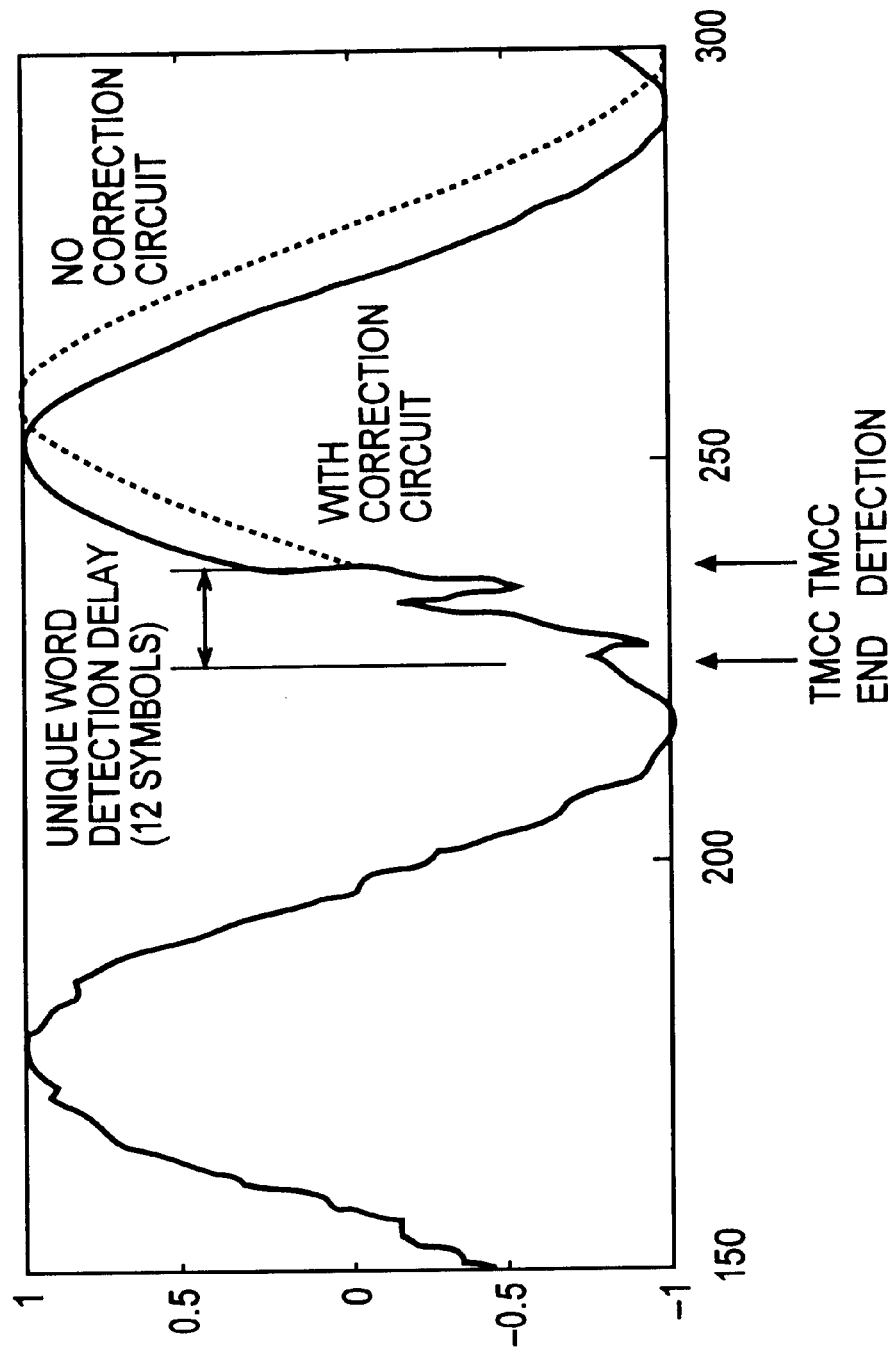
FIG. 11 is a graph for explaining effects of the carrier reproducer shown in FIG. 7.

FIG. 11 is a graph comparing characteristics between the case where the loop filter circuit 55 and the NCO circuit 56 are used (solid line) and a case where the loop filter circuit not having a usual correction function and an NCO circuit are used (dotted line), in which an abscissa indicates the time.

Note that, the carrier reproduction processing of the carrier reproducer 98 is controlled to stop and start by a not illustrated control circuit so that the processing of signals other than the TMCC signals and the burst signal is not carried out.

[Demodulator 99]

The demodulator 99 demodulates the received signal S98 input from the carrier reproducer 98 in units of slot data based on the modulation system indicated by a demodulation system determination signal S107 and outputs a demodulated signal S99 to the viterbi/trellis decoder 101.

[Viterbi/trellis Decoder 101]

The viterbi/trellis decoder 101 selects and performs either of viterbi decoding and trellis decoding for a demodulated signal S99 input from the demodulator 99 in units of slot data based on the demodulation system indicated by the demodulation system determination signal S107 input from the demodulation system determiner 107 and thereby generates a decoded signal S101.

Concretely, the viterbi/trellis decoder 101 performs viterbi decoding of the demodulated signal S99 to generate the decoded signal S101 when the demodulation system indicated by the demodulation system determination signal S107 is either of BPSK and QPSK. At this time, the viterbi/trellis decoder 101 performs viterbi decoding of the demodulated signal S99 by using the bit data of for example 144 bits continuing from the bit data subjected to the viterbi decoding. Note that, the related 144 bits are an example. It is also possible to use the bit data of for example 128 bits.

Further, the viterbi/trellis decoder 101 performs trellis decoding of the demodulated signal S99 to generate the decoded signal S101 when the demodulation system indicated by the demodulation system determination signal S107 is 8PSK.

[Synchronization Signal Detector 106]

The synchronization signal detector 106 detects for example the synchronization word $W_1$ of the frame synchronization signal $TAB_1$ contained in the decoded signal S101 and outputs a synchronization detection signal S106b indicating the detection of the related synchronization word $W_1$ to the demodulation system determiner 107, TMCC detector 108, and the memory control unit 112.

Further, when detecting the synchronization word $W_1$, the synchronization signal detector 106 specifies the timing for detecting the super frame synchronization signal $TAB_2$ next, detects which of the synchronization words $W_2$ and $W_3$ the super frame synchronization signal $TAB_2$ indicates at the related specified timing, and outputs the synchronization detection signal S106b indicating the related detected result to the demodulation system determiner 107, TMCC detector 108, and the memory control unit 112.

Here, as mentioned before, it is in the header frame $F_1$ in the super frame that the super frame synchronization signal $TAB_2$ indicates the synchronization word $W_2$. It indicates $W_3$ in frames $FL_2$ to $FL_8$ other than this. Accordingly, by detecting the synchronization word $W_2$, a timing when the header frame $FL_1$ of the super frame was input can be specified.

Further, the synchronization signal detector 106 outputs the TMCC detection signal S106a for generating the pulse at the timing when the synchronization words $W_2$ and $W_3$ were detected (TMCC signal was detected) or rising to the carrier reproducer 98.

Further, as shown in FIG. 12B, after starting the synchronization search, the synchronization signal detector 106 detects the synchronization word $W_1$ of the frame $FL_8$ of the super frame $SFL_0$ at the time $t_1$, and then sequentially detects the synchronization words $W_2$ of the super frames $SFL_1$, $SFL_2$, and $SFL_3$ at times $t_2$, $t_3$, and $t_4$, and outputs the synchronization detection signal S106b indicating the related detection to the demodulation system determiner 107 and the memory control unit 112.

Figure 12:
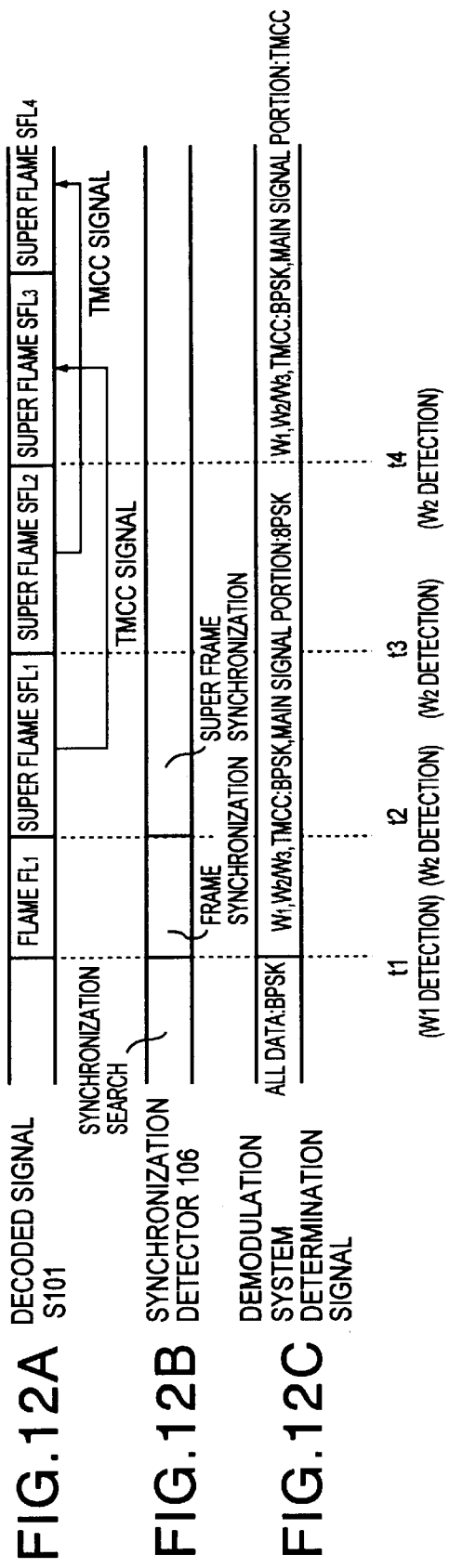
FIGS. 12A to 12C are views for explaining a method for generating a demodulation system determination signal in a modulation system determiner shown in FIG. 6.

Note that, in FIG. 12, although not illustrated, the synchronization signal detector 106 performs also the detection of the synchronization words $W_1$ of the frame synchronization signals $TAB_1$ of frames comprising the super frames $SFL_1$, $SFL_2$, $SFL_3$, and $SFL_4$.

[Demodulation System Determiner 107]

The demodulation system determiner 107 determines the demodulation system to be employed in the processing in the demodulator 99 and the viterbi/trellis decoder 101 as follows based on the synchronization detection signal S106b from the synchronization signal detector 106 and a TMCC signal S105 from the Reed-Solomon decoder 105, as shown below, and outputs the demodulation system determination signal S107 indicating the related determined demodulation system to the demodulator 99 and the viterbi/trellis decoder 101.

Namely, as shown in FIG. 12C, when the synchronization detection signal S106b indicates the detection of the synchronization word $W_1$ at the time $t_1$, the demodulation system determiner 107 determines BPSK as the demodulation system for the frame synchronization signal $TAB_1$, super frame synchronization signal $TAB_2$, and the TMCC signal until the synchronization detection signal S106b indicates the detection of the synchronization word $W_2$ three times after that, that is, until the time $t_4$, while determines 8PSK indicated by the demodulation system setup signal S105 input from for example the outside as the demodulation system for the main signal and outputs the demodulation system determination signal S107 indicating the related determined demodulation system to the demodulator 99 and the viterbi/trellis decoder 101.

The demodulation system determiner 107 determines 8PSK as the demodulation system for the main signal in this way since, by using 8PSK, selected as the demodulation system of the main signal with the highest probability since the TMCC signal S105 corresponding to the super frame SFL to be processed in the demodulator 99 and the viterbi/trellis decoder 101 is not obtained until the synchronization detection signal S106b indicates the detection of the synchronization word $W_2$ three times, it is possible to correctly perform the processing of the main signal in the demodulator 99 and the viterbi/trellis decoder 101 with a high probability.

Further, the main signal of the slot data immediately after the super frame synchronization signal $TAB_2$ is 8PSK modulated with a probability near approximately 100%. Further, the demodulation result of the slot data immediately after the super frame synchronization signal $TAB_2$ is used in the viterbi decoding of the frame synchronization signal $TAB_1$, TMCC signal, and the super frame synchronization signal $TAB_2$ in the viterbi/trellis decoder 101.

Accordingly, even in a case where the corresponding TMCC signal 105 has not yet been obtained, the viterbi decoding of the frame synchronization signal $TAB_1$, TMCC signal, and the super frame synchronization signal $TAB_2$ can be correctly carried out.

Note that it is OK even if the demodulation system determiner 107 determines the modulation system of the main signal by not using a demodulation system setup signal S150 input from the outside, but using a predetermined demodulation system determined in advance until the synchronization detection signal S106b indicates the detection of the synchronization word $W_2$ three times.

Further, as shown in FIG. 12C, the demodulation system determiner 107 determines BPSK as the demodulation system for the frame synchronization signal $TAB_1$, super frame synchronization signal $TAB_2$, and the TMCC signal after the time $t_4$ when the detection of the synchronization word $W_2$ the third time is carried out, while determines the demodulation system for the main signal for every slot data depending on whether or not the TMCC signal S105 was correctly Reed-Solomon decoded as will be mentioned later based on the selectively stored TMCC information and outputs the demodulation system determination signal S107 indicating the related determined demodulation system to the demodulator 99 and the viterbi/trellis decoder 101.

This is because, after the synchronization detection signal S106b indicates the detection of the synchronization word $W_2$ three times, the TMCC signal S105 corresponding to the super frame SFL to be processed in the demodulator 99 and the viterbi/trellis decoder 101 has been already obtained.

The demodulation system determiner 107 determines, in principle, the demodulation system of the main signal of the super frame SFL to be processed at the demodulator 99 and the viterbi/trellis decoder 101 based on the TMCC information indicated by the TMCC signal S105 contained in the super frame SFL two frames before the related super frame SFL.

Note that when the TMCC signal S105 obtained from the super frame SFL two frames before the super frame SFL to be processed at the demodulator 99 and the vlterbi/trellis decoder 101 is not correctly Reed-Solomon decoded, the demodulation system determiner 107 uses the TMCC information which was correctly Reed-Solomon decoded and selected (stored) before that.

Below, an explanation will be made of the selection (storage) of the TMCC information in the demodulation system determiner 107.

Figure 13:
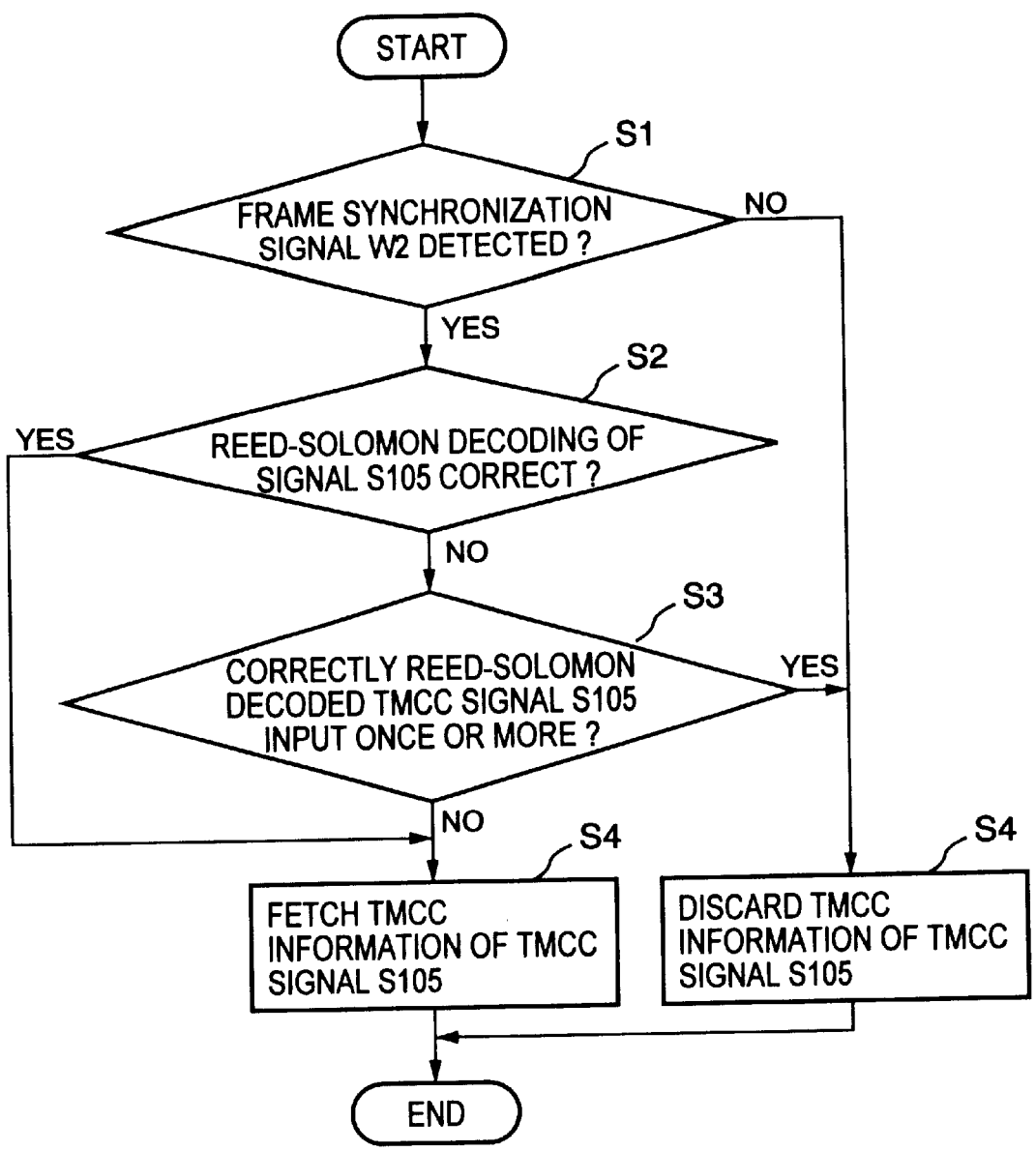
FIG. 13 is a flowchart for explaining selection and storage of TMCC information used when generating the demodulation system determination signal at the modulation system determiner shown in FIG. 6.

FIG. 13 is a flowchart of the selection processing of the TMCC information in the demodulation system determiner 107.

Step S1: The demodulation system determiner 107 discards the TMCC information indicated by the TMCC signal S105 by performing the processing of step S5 until the synchronization detection signal S106b indicates the detection of the synchronization word $W_2$, while executes the processing of step S2 when the synchronization detection signal S106b indicates the detection of the synchronization word $W_2$.

Step S2: The demodulation system determiner 107 performs the processing of step S3 when it decides that the TMCC signal S105 was not correctly Reed-Solomon decoded at the Reed-Solomon decoder 105, while performs the processing of step S4 when it decides that the TMCC signal S105 was correctly Reed-Solomon decoded at the Reed-Solomon decoder 105.

Step S3: The demodulation system determiner 107 decides whether or not the TMCC information of the correctly Reed-Solomon decoded TMCC signal S105 was selected and stored (input) once or more, and where it was selected and stored once or more, performs the processing of step S5 and discards the TMCC information indicated by the TMCC signal S105, while performs the processing of step S4 where it was input first.

Step S4: The demodulation system determiner 107 selects and stores the TMCC information indicated by the TMCC signal S105 where the TMCC signal S105 is not correctly Reed-Solomon decoded and in addition the TMCC information which was correctly Reed-Solomon decoded has not yet been selected and stored even once.

Further, the demodulation system determiner 107 selects and stores the TMCC information indicated by the TMCC signal S105 where the related TMCC signal S105 was correctly Reed-Solomon decoded.

[Buffer Memory 102]

The buffer memory 102 is the deinterleave memory and has a storage capacity capable of storing at least two super frames SFL. In the present embodiment, it has a storage capacity of 218 bytes.

Figure 4:
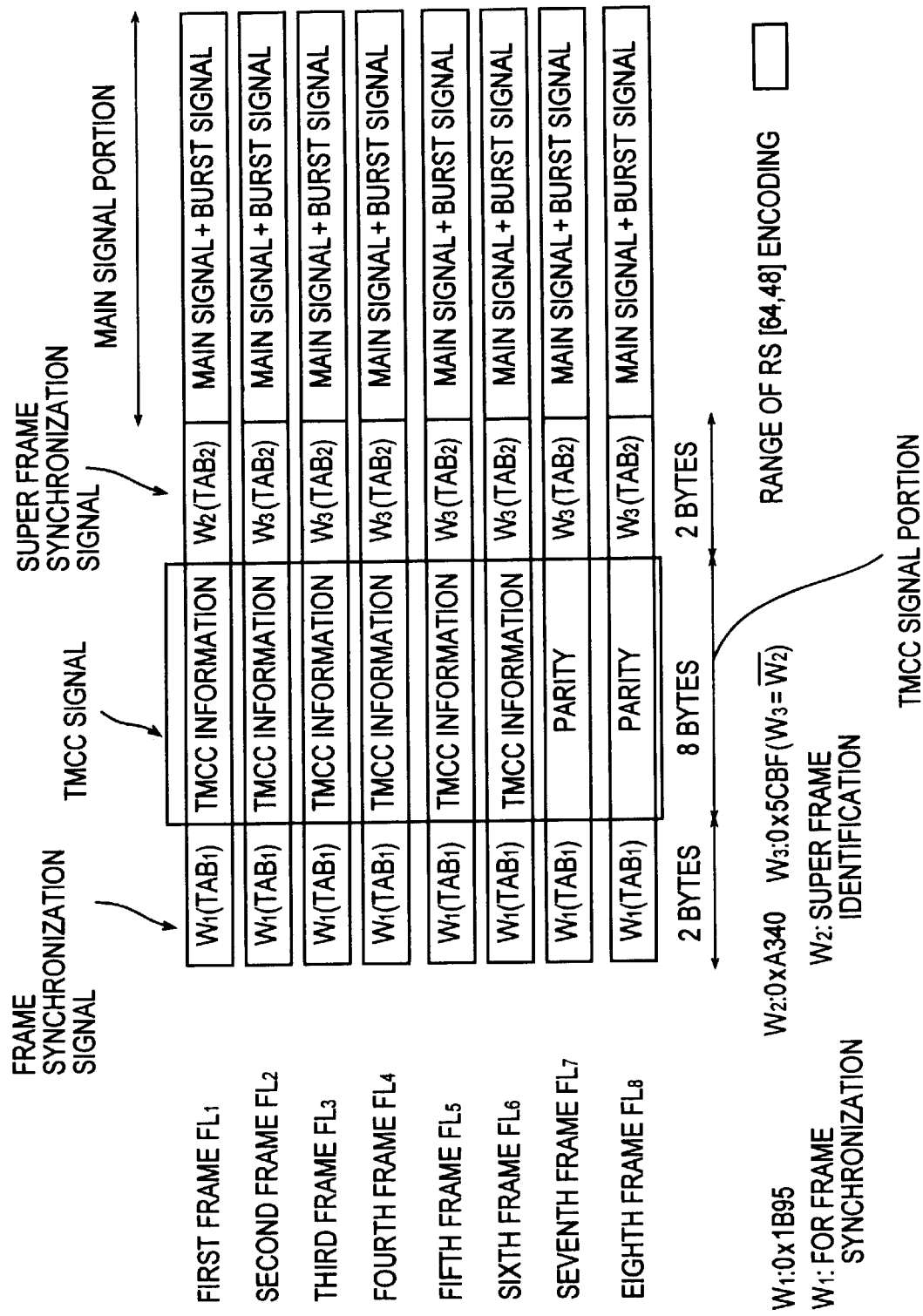
FIG. 4 is a view for explaining the format of the transmission signal of the broadcast satellite transmitter shown in FIG. 1.

Further, the buffer memory 102 writes only the main signal shown in FIG. 4 among the decoded signals S101 based on the control signal S112 from the memory control unit 112 and reads the related written main signal portion as a slot data S102 so as to release the interleave carried out at the interleaver 5 shown in FIG. 1. At this time, in the header byte of the slot data S102, the MPEG use synchronization word is inserted, and the slot data S102 is comprised by 204 bytes of the MPEG use synchronization word and the main signal portion.

[Memory Control Unit 112]

The memory control unit 112 generates a control signal S112 for controlling the write and read operation of the buffer memory 102 and outputs this to the buffer memory 102.

Concretely, the memory control unit 112 has a write counter for performing write control of the buffer memory 102 based on the synchronization detection signal S106b and a read counter for performing the read control of the buffer memory 102 based on the timing signal from the related write counter.

[Energy Inverse Disperser 103]

The energy inverse disperser 103 performs an inverse processing to the processing in the energy disperser 4 shown in FIG. 1 in units of a super frame with respect to the slot data S102 except the header byte and outputs processed slot data S103 to the Reed-Solomon decoder 104.

[Reed-Solomon Decoder 104]

The Reed-Solomon decoder 104 performs Reed-Solomon (204, 188) decoding on the slot data S103 and outputs the result of the related decoding as slot data S104 to a later MPEG decoder.

[TMCC Detector 108]

The TMCC detector 108 detects and extracts the TMCC signal contained in the decoded signal S101 at the timing specified by the synchronization detection signal S106b indicating the detection of the synchronization word W2 and outputs the related extracted TMCC signal as a TMCC signal S108 to the energy inverse disperser 109.

[Energy Inverse Disperser 109]

The energy inverse disperser 109 performs the processing inverse to the processing in the energy disperser 9 shown in FIG. 1 with respect to the TMCC signal S108 and outputs a processed TMCC signal S109 to the Reed-Solomon decoder 105.

[Reed-Solomon Decoder 105]

The Reed-Solomon decoder 105 performs Reed-Solomon (64, 48) decoding in units of a super frame SFL on the TMCC signal S109 and outputs the result of the related decoding as the TMCC signal S105 to the demodulation system determiner 107.

Below, an explanation will be made of the operation of the broadcast satellite receiver 100 shown in FIG. 6.

The broadcast satellite receiver 100 performs the first operation shown below, then the second operation continuing after it.

[First Operation]

The related first operation is carried out until the synchronization detection signal S106b output from the synchronization signal detector 106 indicates the detection of the synchronization word $W_2$ three times, that is, when the TMCC signal S105 corresponding to the super frame SFL to be processed at the demodulator 99 and the viterbi/trellis decoder 101 has not yet been obtained.

First, the transmission signal S10 shown in FIG. 5 is received as the received signal S97 at the antenna of the broadcast satellite receiver 100 via the broadcast satellite, and the received signal S97 is output to the carrier reproducer 98.

Further, the TMCC detection signal S106a generated at the synchronization signal detector 106 is output to the carrier reproducer 98.

Then, the carrier reproducer 98 carries out the carrier reproduction processing by using the received signal S97 and the TMCC detection signal S106a and outputs the carrier reproduced received signal S98 to the demodulator 99.

Then, until the synchronization detection signal S106b output from the synchronization signal detector 106 indicates the detection of the synchronization word $W_2$ three times, that is, up to the time $t_4$ shown in FIG. 7, the demodulator 99 carries out BPSK demodulation on the frame synchronization signal $TAB_1$, super frame synchronization signal $TAB_2$, and the TMCC signal contained in the received signal S98 based on the demodulation system determination signal S107. Further, the demodulator 99 performs 8PSK demodulation on the main signal contained in the received signal S98 when 8PSK is selected as the demodulation system of the main signal with the highest probability based on the demodulation system determination signal S107. Then, the demodulated signal S99 is output from the demodulator 99 to the viterbi/trellis decoder 101.

Next, until the synchronization detection signal S106b output from the synchronization signal detector 106 indicates the detection of the synchronization word $W_2$ three times, the viterbi/trellis decoder 101 carries out viterbi decoding on the frame synchronization signal $TAB_1$, super frame synchronization signal $TAB_2$, and the TMCC signal contained in the demodulated signal S99 based on the demodulation system determination signal S107. Further, the viterbi/trellis decoder 101 performs trellis decoding on the main signal contained in the demodulated signal S99 based on the demodulation system determination signal S107. Then, the decoded signal S101 is output from the viterbi/trellis decoder 101 to the buffer memory 102, synchronization signal detector 106, and the TMCC decoder 108.

Next, the processing in the buffer memory 102, energy inverse disperser 103, and the Reed-Solomon decoder 104, the processing in the TMCC detector 108, energy inverse disperser 109, and the Reed-Solomon decoder 105, and the processing in the synchronization signal detector 106 are carried out in parallel.

Namely, based on the control signal S112, the main signal contained in the decoded signal S101 is written into the buffer memory 102, and the related written signal is read out as the slot data S102 so as to release the interleave and output to the energy inverse disperser 103.

Next, the slot data S102 is passed through the energy inverse diffusion processing in the energy inverse disperser 103 and output as the slot data S103 to the Reed-Solomon decoder 104.

Next, the slot data S103 is Reed-Solomon decoded at the Reed-Solomon decoder 104 and output as the slot data S104 to the later MPEG decoder.

Further, in parallel to the above processing, the TMCC signal contained in the decoded signal S101 is detected at the TMCC decoder 108, and the related detected TMCC signal S108 is output to the energy inverse disperser 109.

Next, the TMCC signal S108 passes through the energy inverse dispersal processing at the energy inverse disperser 109 and is output as the TMCC signal S109 to the Reed-Solomon decoder 105.

Next, the TMCC signal S109 is Reed-Solomon decoded at the Reed-Solomon decoder 105 and output as the TMCC signal S105 to the demodulation system determiner 107.

Further, in parallel to the above processing, the synchronization signal detector 106 detects the synchronization word indicated by the frame synchronization signal $TAB_1$ and the super frame synchronization signal $TAB_2$ contained in the decoded signal S101 and outputs the synchronization detection signal S106b indicating the related detection to the demodulation system determiner 107, TMCC detector 108, and the memory control unit 112.

Then, until the synchronization detection signal S106b indicates the detection of the synchronization word $W_2$ three times, that is, for a term up to the time $t_4$ shown in FIG. 7, the demodulation system determiner 107 determines BPSK as the demodulation system for the frame synchronization signal $TAB_1$, super frame synchronization signal $TAB_2$, and the TMCC signal, while determines 8PSK indicated by the demodulation system setup signal S105 input from for example the outside as the demodulation system for the main signal, and outputs the demodulation system determination signal S107 indicating the related determined demodulation system to the demodulator 99 and the viterbi/trellis decoder 101.

[Second Operation]

Thereafter, when the synchronization detection signal S106b output from the synchronization signal detector 106 indicates the detection of the synchronization word $W_2$ three times, that is, when the TMCC signal S105 corresponding to the super frame SFL to be processed at the demodulator 99 and the viterbi/trellis decoder 101 is obtained, the following second operation is carried out continuing from the first operation mentioned above.

First, similar to the first operation, the transmission signal S10 shown in FIG. 5 is received at the antenna of the broadcast satellite receiver 100 via the broadcast satellite as the received signal S97, and the received signal S97 is output to the carrier reproducer 98.

Further, the TMCC detection signal S106a generated at the synchronization signal detector 106 is output to the carrier reproducer 98.

Then, the carrier reproducer 98 performs carrier reproduction processing using the received signal S97 and the TMCC detection signal S106 and outputs the carrier reproduced received signal S98 to the demodulator 99.

Then, the demodulator 99, similar to the first operation, performs BPSK demodulation on the frame synchronization signal $TAB_1$, super frame synchronization signal $TAB_2$, and the TMCC signal contained in the received signal S98 based on the demodulation system determination signal S107.

Further, the demodulator 99 demodulates the main signal contained in the received signal S98 by the demodulation system which the TMCC information passed through the processing shown in FIG. 8 mentioned before and stored in the demodulation system determiner 107 indicates for every slot data based on the demodulation system determination signal S107. At this time, the demodulation system of the main signal indicated by the demodulation system determination signal S107 is determined, in principle, by using the TMCC information contained in the super frame SFL two frames before the super frame SFL of the received signal S98 to be demodulated at the demodulator 99.

Next, after the synchronization detection signal S106b output from the synchronization signal detector 106 indicates the detection of the synchronization word $W_2$ three times, the viterbi/trellis decoder 101 performs viterbi decoding of the frame synchronization signal $TAB_1$, super frame synchronization signal $TAB_2$, and the TMCC signal contained in the demodulated signal S99 based on the demodulation system determination signal S107. Further, the viterbi/trellis decoder 101 selects and performs one of viterbi decoding and trellis decoding for the main signal contained in the demodulated signal S99 based on the demodulation system determination signal S107 generated at the demodulation system determiner 107 based on the TMCC signal S105.

Then, the decoded signal S101 is output from the viterbi/trellis decoder 101 to the buffer memory 102, synchronization signal detector 106, and the TMCC detector 108.

Thereafter, similar to the case of the first operation, the processing in the buffer memory 102, energy inverse disperser 103, Reed-Solomon decoder 104, TMCC detector 108, energy inverse disperser 109, Reed-Solomon decoder 105, and synchronization signal detector 106 are carried out.

Further, when the synchronization detection signal S106b indicates the detection of the synchronization word $W_2$ three times, that is, after the time $t_4$ shown in FIG. 7, the demodulation system determiner 107 determines BPSK as the demodulation system for the frame synchronization signal $TAB_1$, super frame synchronization signal $TAB_2$, and the TMCC signal, while determines a demodulation system corresponding to the modulation system indicated by the TMCC information stored based on the processing of the flowchart shown in FIG. 8 for every slot data for the main signal, and outputs the demodulation system determination signal S107 indicating the related determined demodulation system to the demodulator 99 and the viterbi/trellis decoder 101.

As explained above, according to the broadcast satellite receiver 100, at the timing when the TMCC signal is detected at the synchronization signal detector 106, even if the carrier reproducer 98 has received as its inputs signals other than the TMCC signal contained in the received signal S97, the internal state of the carrier reproducer 98 can be switched to the state where the TMCC signal is being input. For this reason, it is possible to avoid the carrier reproducer 98 processing signals modulated by a modulation system other than BPSK modulation and avoid mixing of noise into the carrier reproduction loop (synchronization loop). As a result, the speed of the convergence of the carrier reproduction loop of the carrier reproducer 98 can be raised and, at the same time, the precision of the carrier reproduction can be improved and the performance of the broadcast satellite receiver 100 can be improved.

The present invention is not limited to the embodiments.

For example, in the embodiments, the case where the received signal S97 was BPSK modulated was exemplified, but the received signal S97 may also be modulated by another modulation system for example quadrature PSK (QPSK). Note that when the received signal S97 is modulated by QPSK, the above s becomes 4, and the 12-symbol delay circuits 77 and 83 shown in FIG. 8 and FIG. 10 delay the input signals exactly by 48 (=12×4) symbols' worth of time and output the same.

Further, in the embodiments, the case where there was a delay of about 12 symbols' worth of time from when the carrier reproducer 98 started the input of the TMCC signal contained in the received signal S97 to when a pulse was generated in the TMCC detection signal S106a was exemplified, but the related delay time is not particularly limited.

As explained above, according to the carrier reproduction circuit of the present invention, the carrier reproduction can be carried out at a high speed and with a high precision.

Further, according to the receiver of the present invention, the received signals can be processed at a high speed and with a high precision.

Further, according to the loop filter circuit and oscillator circuit of the present invention, by using them in for example a carrier reproduction circuit, an increase of speed and enhancement of the precision of these circuits are enabled.

What is claimed is:

1. A carrier reproduction circuit for reproducing a carrier of an input signal modulated to change in carrier according to the types of symbols by processing using a synchronization loop, comprising:

a differential detection circuit for detecting a difference between said input signal and a signal fed back in said synchronization loop to generate a first signal, a loop filter circuit for processing said first signal to generate a second signal by a first integration loop containing a first delay circuit for giving n (n is a natural number) symbols worth of delay and inputting said first signal of m (m is a natural number) symbols before to said first integration loop in accordance with a switch signal, an oscillator circuit for feeding back an oscillation signal, which is produced by using said second signal by using a second integration loop containing a second delay circuit for giving n symbols worth of delay, toward said differential detection circuit, and switching said second integration loop to a state holding said second signal of m symbols before in accordance with said switch signal, a signal generation circuit for generation a carrier reproduced signal by using said input signal and said oscillation signal; and wherein said loop filter circuit has:

a first adder circuit for adding said first signal and a third signal and outputting the result toward said first delay circuit, a third delay circuit for delaying the output of said first adder circuit by exactly m symbols, a selection circuit for selecting either of the output of said first delay circuit and or the output of said third delay circuit in accordance with said switch signal and outputting the result as said third signal to said first adder circuit, and a second adder circuit for adding said first signal and the output of said first adder circuit to calculate said second signal.

2. A carrier reproduction circuit as set forth in claim 1, wherein:

said input signal is a signal modulated to change the phase of the carrier in accordance with the type of the symbol, said differential detection circuit generates said first signal indicating the difference in phases between said input signal and the signal fed back in said synchronization loop, and said carrier reproduction circuit further has a multiplier circuit for performing multiplication based on said signal fed back and said input signal to generate a carrier reproduced signal.

3. A receiver for processing received signals containing a main signal modulated by a modulation system selected from among a plurality of modulation systems for changing the carrier in accordance with the type of the symbol and a modulation system indication signal indicating the modulation system of said main signal and modulated by a modulation system determined in advance, comprising:

a carrier reproduction circuit for processing said modulation system indication signal contained in said received signals to reproduce carriers by using a synchronization loop, a demodulation circuit for demodulating said carrier reproduced received signals by indicated demodulation systems, a signal detection circuit for detecting said modulation system indication signal contained in said demodulated received signals and outputting a detection signal indicating the related detection timing to said carrier reproduction circuit, and a demodulation system determination circuit for indicating the demodulation system corresponding to the modulation system indicated by said detected modulation system indication signal to said demodulation circuit, wherein said carrier reproduction circuit has:

a differential detection circuit for detecting a difference between said input signal and a signal fed back in said synchronization loop to generate a first signal, a loop filter circuit for processing said first signal to generate a second signal by a first integration loop containing a first delay circuit for giving n (n is a natural number) symbols worth of delay and inputting said first signal of m (m is a natural number) symbols before to said first integration loop in accordance with a switch signal, an oscillator circuit for feeling back an oscillation signal, which is produced by using said second signal by using a second integration loop containing a second delay circuit for giving n symbols worth of delay, toward said differential detection circuit, and switching said second integration loop to a state holding said second signal of m symbols before in accordance with said switch signal, and a signal generation circuit for generating a carrier reproduced signal by using said input signal and said oscillation signal; and wherein said loop filter circuit has:

a first adder circuit for adding said first signal and a third signal and outputting the result toward said first delay circuit, a third delay circuit for delaying the output of said first adder circuit by exactly m symbols, a selection circuit for selecting either of the output of said first delay circuit and or the output of said third delay circuit in accordance with said switch signal and outputting the result as said third signal to said first adder circuit, and a second adder circuit for adding said first signal and the output of said first adder circuit to calculate said second signal.

4. A receiver as set forth in claim 3, wherein:

said received signal is a signal modulated for changing in phase the carrier in accordance with a plurality of types of symbols, said differential detection circuit generates said first signal indicating the difference in phase between said received signal and the signal fed back at said synchronization loop, and said carrier reproduction circuit further has a multiplier circuit for performing multiplication based on said signal fed back and said input signal to generate a carrier reproduced signal.

5. An oscillator circuit used in a carrier reproduction circuit for reproducing a carriers of an input signal modulated to change in phase of the carrier in accordance with the type of symbols by processing using a synchronization loop, comprising:

a first adder circuit for adding an input phase differential signal and phase signal to generate a carrier phase reproduced signal, a first delay circuit for delaying the output of said first adder circuit by exactly n (n is a natural number) symbols, an amplifier circuit for amplifying said phase differential signal to m (m is a natural number)×s times when a single symbol can express s number of statuses, a second adder circuit for adding the output of said first adder circuit and the output of said amplifier circuit, a second delay circuit for delaying the output of said second adder circuit by exactly m symbols, and a selection circuit for selecting either of the output of said first delay circuit or the output of said second delay circuit in accordance with said switch signal and outputting the same as the phase signal to said first adder circuit, and a signal generation circuit for generating an oscillation signal having a phase indicated by said phase signal.

* * * * *